(12) United States Patent
Cheng et al.

(10) Patent No.: US 9,224,654 B2
(45) Date of Patent: Dec. 29, 2015

(54) FIN CAPACITOR EMPLOYING SIDEWALL IMAGE TRANSFER

(71) Applicant: International Business Machines Corporation, Armonk, NY (US)

(72) Inventors: Kangguo Cheng, Schenectady, NY (US); Ramachandra Divakaruni, Ossining, NY (US); Shom S. Ponoth, Gaithersburg, MD (US); Theodorus E. Standaert, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 36 days.

(21) Appl. No.: 14/088,473

(22) Filed: Nov. 25, 2013

(65) Prior Publication Data

US 2015/0145008 A1    May 28, 2015

(51) Int. Cl.
  *H01L 27/108* (2006.01)
  *H01L 21/8234* (2006.01)
  *H01L 23/538* (2006.01)
  *H01L 27/06* (2006.01)
  *H01L 49/02* (2006.01)

(52) U.S. Cl.
  CPC .... *H01L 21/823431* (2013.01); *H01L 23/5384* (2013.01); *H01L 27/0629* (2013.01); *H01L 28/90* (2013.01); *H01L 28/92* (2013.01); *H01L 2924/0002* (2013.01)

(58) Field of Classification Search
  CPC ... H01L 27/0805; H01L 28/40; H01L 29/785; H01L 28/90
  See application file for complete search history.

(56) References Cited

U.S. PATENT DOCUMENTS

| | | |
|---|---|---|
| 2005/0266638 A1* | 12/2005 | Cho et al. ............... 438/257 |
| 2007/0215960 A1* | 9/2007 | Zhu et al. ............... 257/414 |
| 2011/0298025 A1* | 12/2011 | Haensch et al. ........ 257/296 |
| 2012/0235234 A1 | 9/2012 | Chang et al. |
| 2012/0235240 A1 | 9/2012 | Dixit |
| 2012/0313170 A1 | 12/2012 | Chang et al. |

FOREIGN PATENT DOCUMENTS

| | | |
|---|---|---|
| EP | 1644988 B1 | 3/2010 |
| EP | 1532659 B1 | 3/2011 |

* cited by examiner

*Primary Examiner* — Thao X Le
*Assistant Examiner* — Laura Dykes
(74) *Attorney, Agent, or Firm* — Scully, Scott, Murphy & Presser, P.C.; Steven J. Meyers, Esq.

(57) ABSTRACT

Spacer structures are formed around an array of disposable mandrel structures and above a doped semiconductor material portion. A sidewall image transfer process is employed to pattern an upper portion of the doped semiconductor material portion into an array of doped semiconductor fins. After formation of a dielectric material layer on the top surfaces and sidewall surfaces of the doped semiconductor fins, gate-level mandrel structures are formed to straddle multiple semiconductor fins. A conductive hole-containing structure is formed to laterally surround a plurality of gate-level mandrel structures, which is subsequently removed. A contact-level dielectric layer is formed over the conductive hole-containing structure and the plurality of doped semiconductor fins. The semiconductor fins function as a lower electrode of a fin capacitor, and the conductive hole-containing structure functions as an upper electrode of the fin capacitor.

19 Claims, 20 Drawing Sheets

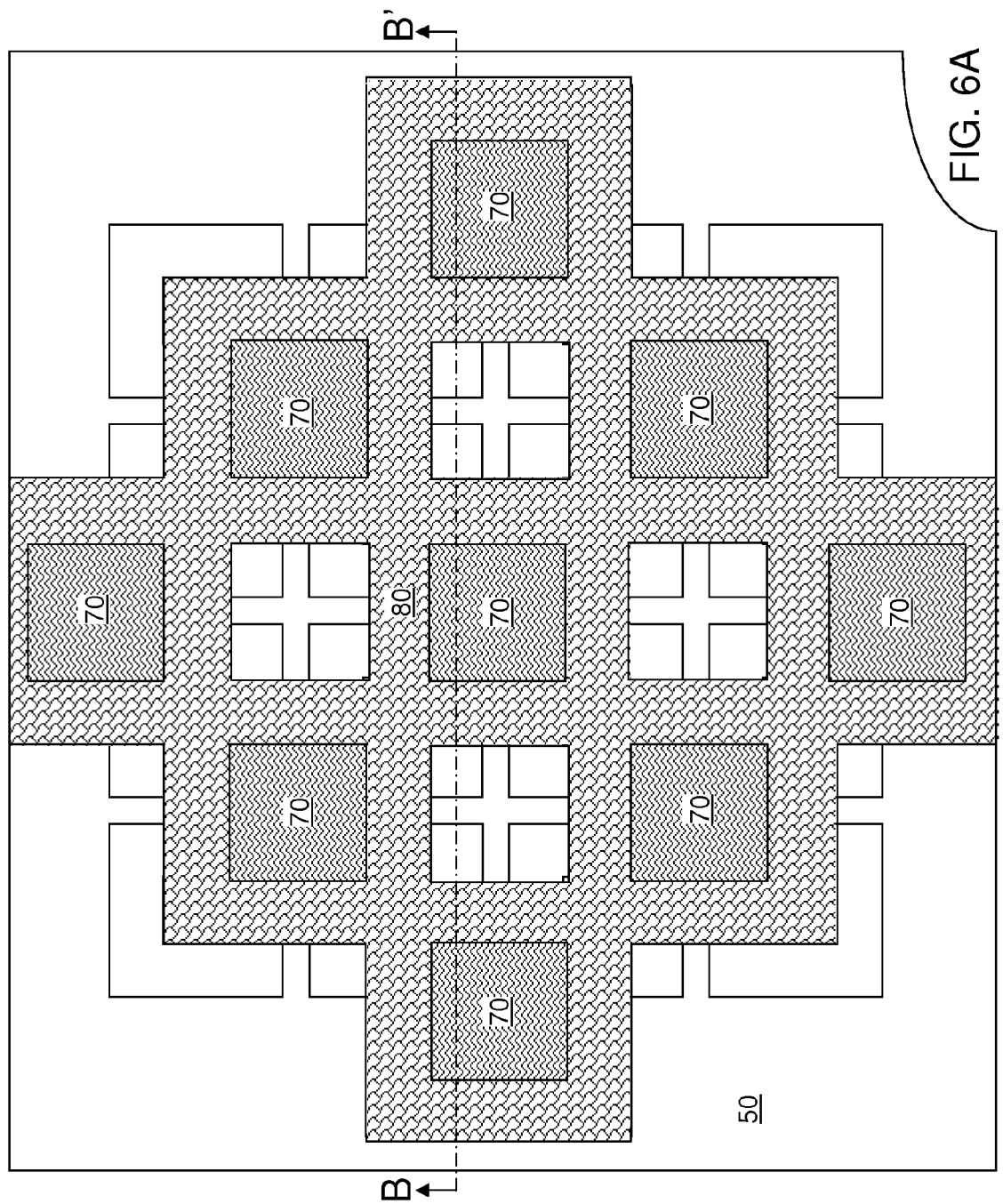

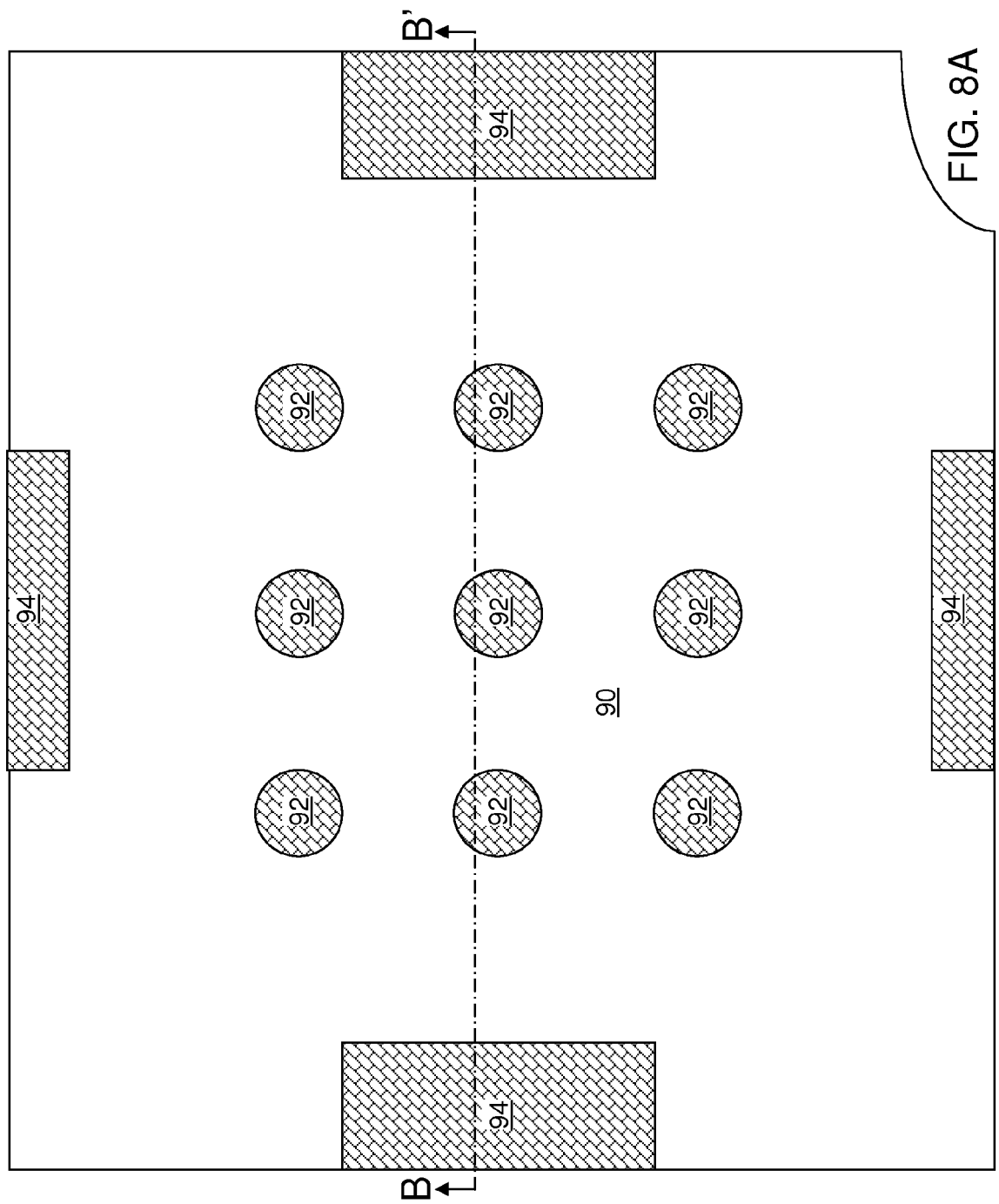

FIN CAPACITOR EMPLOYING SIDEWALL IMAGE TRANSFER

BACKGROUND

The present disclosure relates to a semiconductor structure including a capacitor, and particularly to a capacitor formed on an array of semiconductor fins and a method of forming the same.

Advanced semiconductor chips employ fin field effect transistors to provide enhanced performance and greater on-current per unit device area. Various additional semiconductor devices are desirable that are compatible with fin field effect transistors in order to provide functional versatility to semiconductor chips. One of such desirable semiconductor devices is a capacitor that can provide low internal resistance while being compatible with the processing steps for forming fin field effect transistors.

SUMMARY

Spacer structures are formed around an array of disposable mandrel structures and above a doped semiconductor material portion. A sidewall image transfer process is employed to pattern an upper portion of the doped semiconductor material portion into an array of doped semiconductor fins. After formation of a dielectric material layer on the top surfaces and sidewall surfaces of the doped semiconductor fins, gate-level mandrel structures are formed to straddle multiple semiconductor fins. A conductive hole-containing structure is formed to laterally surround a plurality of gate-level mandrel structures, which is subsequently removed. A contact-level dielectric layer is formed over the conductive hole-containing structure and the plurality of doped semiconductor fins. The semiconductor fins function as a lower electrode of a fin capacitor, and the conductive hole-containing structure functions as an upper electrode of the fin capacitor. Electrical contact to the semiconductor fins can be provided in regions previously occupied by the gate-level mandrel structures. Electrical contact to the conductive hole-containing structure can be provided in peripheral regions in which the plurality of doped semiconductor fins is not present.

According to an aspect of the present disclosure, a semiconductor structure includes a capacitor. The capacitor contains a lower electrode, a node dielectric layer, and an upper electrode. The lower electrode includes an array of semiconductor fins located on a substrate. Each of the semiconductor fins has a contiguous inner sidewall that laterally surrounds a cavity therein. The node dielectric layer contacts sidewalls and top surfaces of the array of semiconductor fins. The upper electrode includes a conductive hole-containing structure that contains a plurality of holes therein. The conductive hole-containing structure straddles multiple portions of each of the semiconductor fins.

According to another aspect of the present disclosure, a method of forming a semiconductor structure including a capacitor is provided. A lower electrode including an array of semiconductor fins is formed on a substrate. Each of the semiconductor fins has a contiguous inner sidewall that laterally surrounds a cavity therein. A node dielectric layer is formed directly on sidewalls and top surfaces of the array of semiconductor fins. An upper electrode including a conductive hole-containing structure is formed. The conductive-hole containing structure contains a plurality of holes therein and straddles multiple portions of each of the semiconductor fins.

BRIEF DESCRIPTION OF SEVERAL VIEWS OF THE DRAWINGS

FIG. 6A is a top-down view of the exemplary semiconductor structure after formation of a conductive-hole containing structure according to an embodiment of the present disclosure.

FIG. 8A is a top-down view of the exemplary semiconductor structure after formation of a contact-level dielectric layer and various contact via structures according to an embodiment of the present disclosure.

DETAILED DESCRIPTION

Figure 1A:
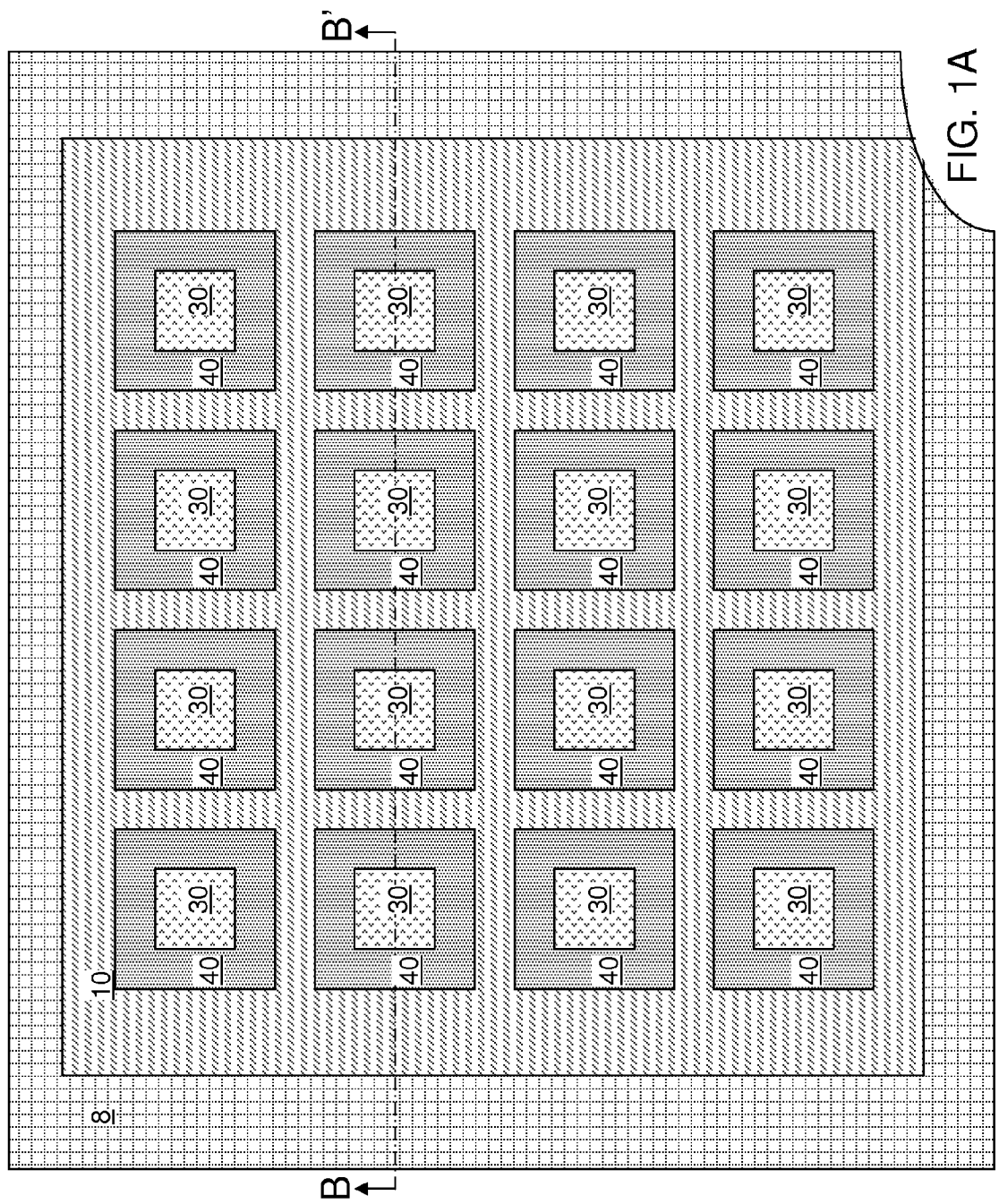
FIG. 1A is a top-down view of an exemplary semiconductor structure after formation of an array of disposable mandrel structures and spacer structures according to an embodiment of the present disclosure.

As stated above, the present disclosure relates to a capacitor formed on an array of semiconductor fins and a method of forming the same. Aspects of the present disclosure are now described in detail with accompanying figures. It is noted that like reference numerals refer to like elements across different embodiments. Elements with the same reference numerals have the same composition across different embodiments unless expressly indicated otherwise. The drawings are not necessarily drawn to scale.

Figure 1B:
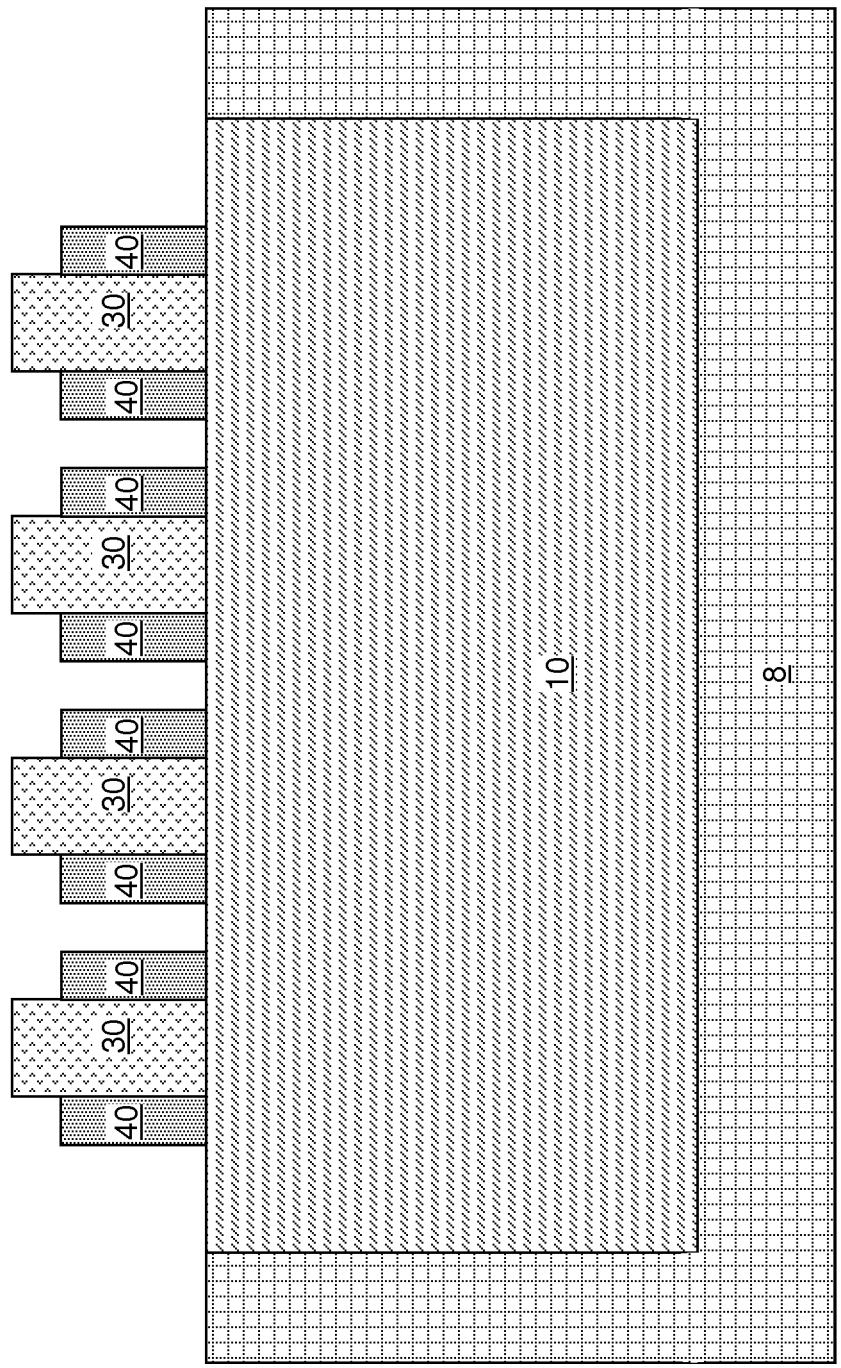
FIG. 1B is a vertical cross-sectional view of the exemplary semiconductor structure along the vertical plane B-B' of FIG. 1A.

Referring to FIGS. 1A and 1B, an exemplary semiconductor structure according to an embodiment of the present disclosure includes a semiconductor substrate (8, 10) that includes a semiconductor material. The semiconductor material of the semiconductor substrate (8, 10) can be an elemental semiconductor material, an alloy of at least two elemental semiconductor materials, a compound semiconductor material, or an organic semiconductor material. In one embodiment, at least an upper portion of the semiconductor substrate (8, 10) can be single crystalline. In another embodiment, the entirety of the semiconductor substrate (8, 10) can be single crystalline.

Optionally, a portion of the semiconductor substrate (8, 10) can be a doped semiconductor material portion 10, which can be p-doped or n-doped. In one embodiment, the doped semiconductor material portion 10 can be embedded within a substrate semiconductor portion 8, which can have a lower dopant concentration and/or doping of the opposite conductivity type than the doping of the doped semiconductor material portion 10. In one embodiment, the doped semiconductor material portion 10 can have a dopant concentration in a range from $1.0 \times 10^{18}/cm^3$ to $3.0 \times 10^{21}/cm^3$. In one embodiment, a p-n junction can be formed across the doped semiconductor material portion 10 and the substrate semiconductor portion 8 to provide electrical isolation of the doped semiconductor material portion 10 with respect to the substrate semiconductor portion 8. Optionally a hardmask layer (not shown) can be formed on top of the semiconductor substrate (8, 10) to facilitate the downstream processes. For example, the hardmask can be a dielectric such as silicon nitride.

An array of disposable mandrel structures 30 is formed on the top surface of the doped semiconductor material portion 10. The array of disposable mandrel structures 30 can be formed, for example, by depositing a disposable mandrel material layer (not shown) and patterning the disposable mandrel material layer, for example, by a combination of lithographic methods and an etch, which can be an anisotropic etch or an isotropic etch.

The disposable mandrel structures 30 can include a semiconductor material, a dielectric material, or a conductive material, provided that the material of the disposable mandrel structures 30 is different from the material of the semiconductor substrate (8, 10), or different from the hardmask layer (if present) on top of the semiconductor substrate (8, 10). In one embodiment, the disposable mandrel structures 30 can include silicon, a silicon-germanium alloy, germanium, amorphous carbon, silicon oxide, silicon oxynitride, silicon nitride, a dielectric metal oxide, a dielectric metal nitride, a photoresist material, an organic material, an elemental metal, an intermetallic alloy, a metal oxide, a metal nitride, or any other material different from the material of the semiconductor substrate (8, 10). The height of the disposable mandrel structures 30 can be, for example, from 10 nm to 500 nm, although lesser and greater thicknesses can also be employed.

A spacer structure 40 is formed around each disposable mandrel structure 30. The spacer structures 40 can be formed by depositing a spacer material layer (not shown) on the top surface of the semiconductor substrate (8, 10) and on the top surface and sidewalls of the disposable mandrel structures 30, and removing horizontal portions of the spacer material layer by an anisotropic etch, such as a reactive ion etch. The remaining vertical portions of the spacer material layer constitute the spacer structures 40.

The spacer structures 40 can include a semiconductor material, a dielectric material, or a conductive material, provided that the material of the spacer structures 40 is different from the material of the disposable mandrel structures 30 and from the material of the semiconductor substrate (8, 10), or different from the hardmask layer (if present) on top of the semiconductor substrate (8, 10). In one embodiment, the spacer structures 40 can include silicon, a silicon-germanium alloy, germanium, amorphous carbon, silicon oxide, silicon oxynitride, silicon nitride, a dielectric metal oxide, a dielectric metal nitride, an organic material, an elemental metal, an intermetallic alloy, a metal oxide, a metal nitride, or any other material different from the material of the semiconductor substrate (8, 10) and from the material of the disposable mandrel structures 30. In an illustrative example, the disposable mandrel structures 30 can include germanium, silicon-germanium alloy, or amorphous carbon, and the spacer structures 40 can include silicon oxide, silicon nitride, or silicon oxynitride.

The thickness of each spacer structure 40, i.e., the lateral dimension between an inner sidewall of the spacer structure 40 and an outer sidewall that is most proximate to the inner sidewall, is not limited by lithographic capabilities of available lithography tools. Thus, the thickness of each spacer structure 40 can be a sublithographic dimension, i.e., a dimension that is less than the smallest dimension that can be printed by single lithographic exposure. In one embodiment, the thickness of a spacer structure 40 can be from 1 nm to 100 nm, although lesser and greater thicknesses can also be employed. In one embodiment, the aspect ratio of a spacer structure 40, i.e., the ratio of the height of the spacer structure 40 to the thickness of the spacer structure 40, can be in a range from 2.5 to 100.

In one embodiment, the horizontal cross-sectional shape of each disposable mandrel structure 30 can be a polygon or a curvilinear closed shape. In one embodiment, the horizontal cross-sectional shape of each disposable mandrel structure 130 can be a polygon or an ellipse (which include a circle). In one embodiment, the array of disposable mandrel structures 30 can be a two-dimensional periodic array having a periodicity along two independent horizontal directions within an area bounded by the area of the doped semiconductor material portion 10. In this case, the spacer structures 40 can also form a two-dimensional array having a periodicity along two independent horizontal directions.

In one embodiment, formation of the disposable mandrel structures 30 can be performed concurrently with formation of additional disposable mandrel structures (not shown) that can be employed to form additional semiconductor fins (not shown) for forming fin field effect transistors as known in the art. In one embodiment, formation of the spacer structures 40 can be performed concurrently with formation of additional spacer structures (not shown) that can be employed to form additional semiconductor fins (not shown) for forming fin field effect transistors as known in the art.

Figure 2A:
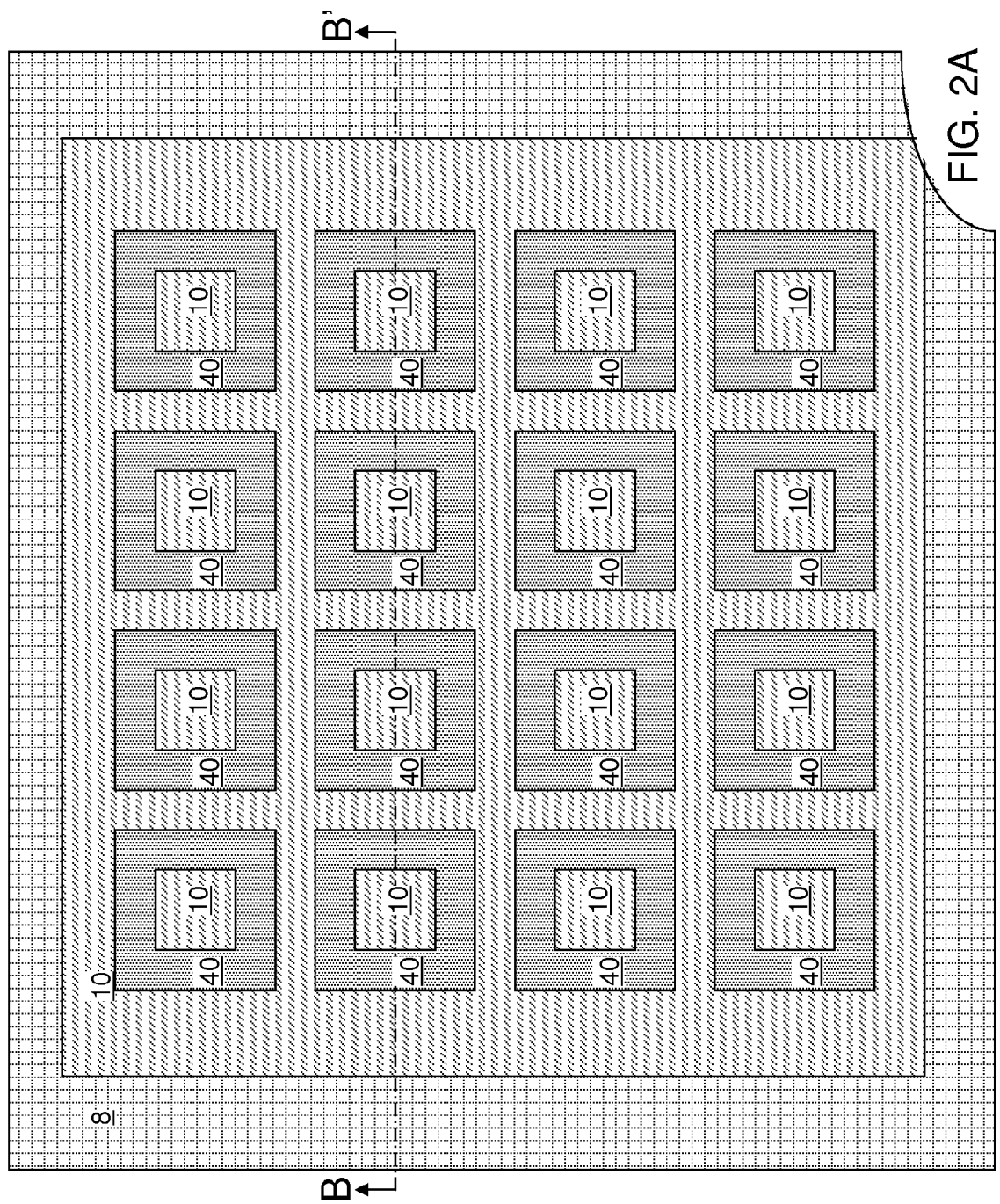
FIG. 2A is a top-down view of the exemplary semiconductor structure after removal of the array of disposable mandrel structures according to an embodiment of the present disclosure.
Figure 2B:
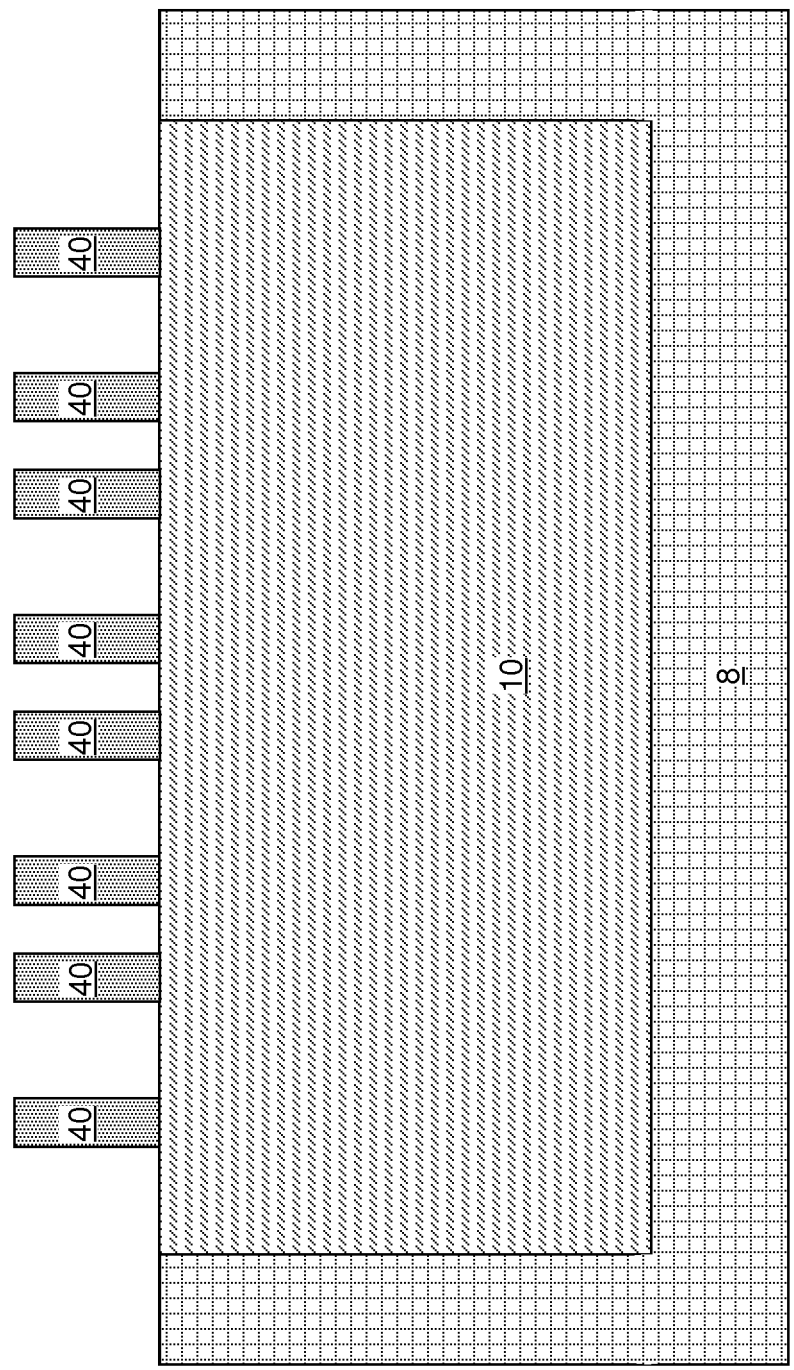
FIG. 2B is a vertical cross-sectional view of the exemplary semiconductor structure along the vertical plane B-B' of FIG. 2A.

Referring to FIGS. 2A and 2B, the array of disposable mandrel structures 30 can be removed selective to the spacer structures 40 by an etch, which can be an isotropic etch or an anisotropic etch. In one embodiment, an etch chemistry that removes the disposable mandrel structures 30 can be selective to the semiconductor material(s) of the semiconductor substrate (8, 10). The etch chemistry of the etch can be selected from etch chemistries known in the art.

In one embodiment, removal of the disposable mandrel structures 30 can be performed concurrently with removal of additional disposable mandrel structures (not shown) that can be employed to form additional semiconductor fins (not shown) for forming fin field effect transistors as known in the art.

Figure 3A:
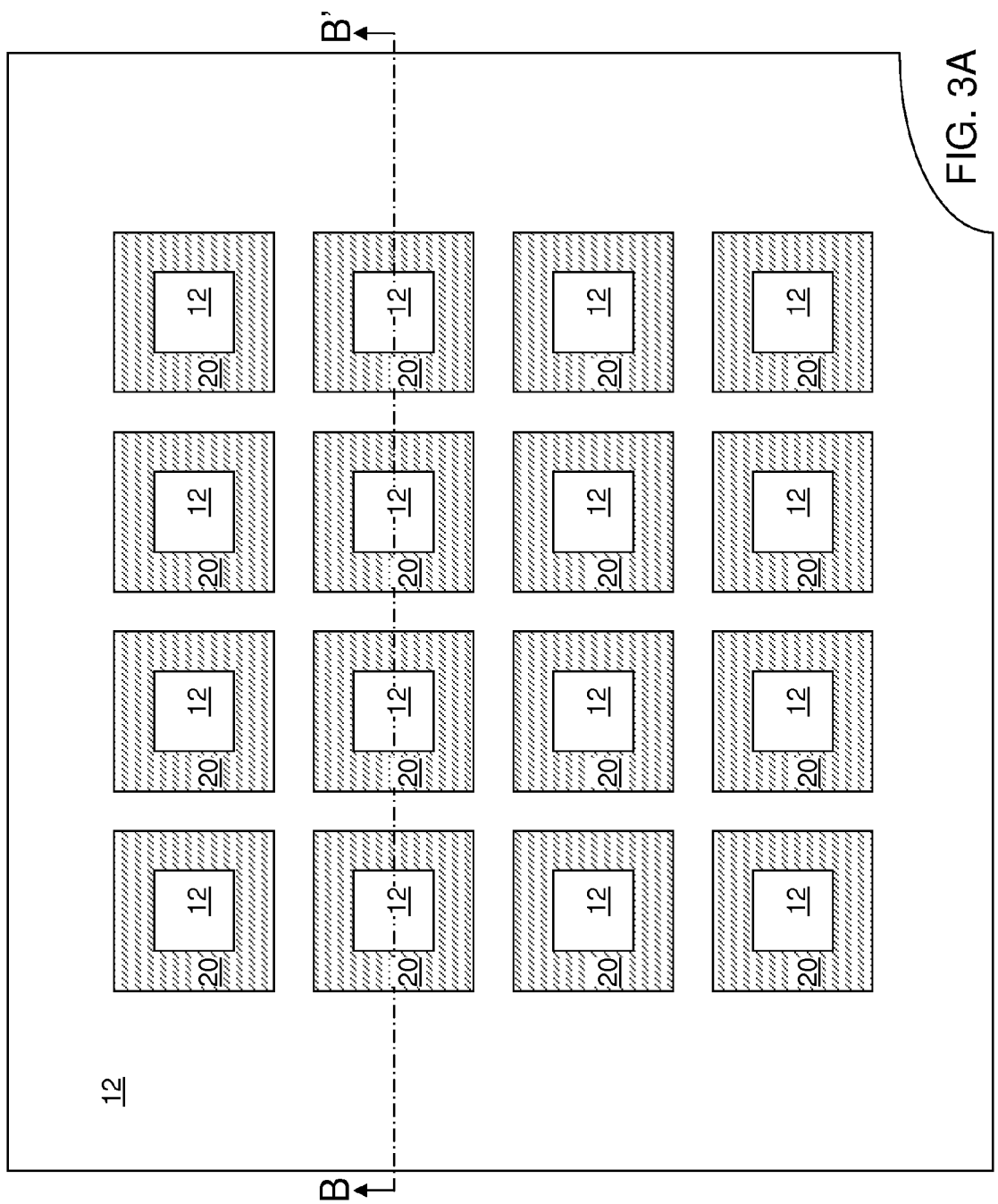
FIG. 3A is a top-down view of the exemplary semiconductor structure after formation of semiconductor fins and a shallow trench isolation layer according to an embodiment of the present disclosure.
Figure 3B:
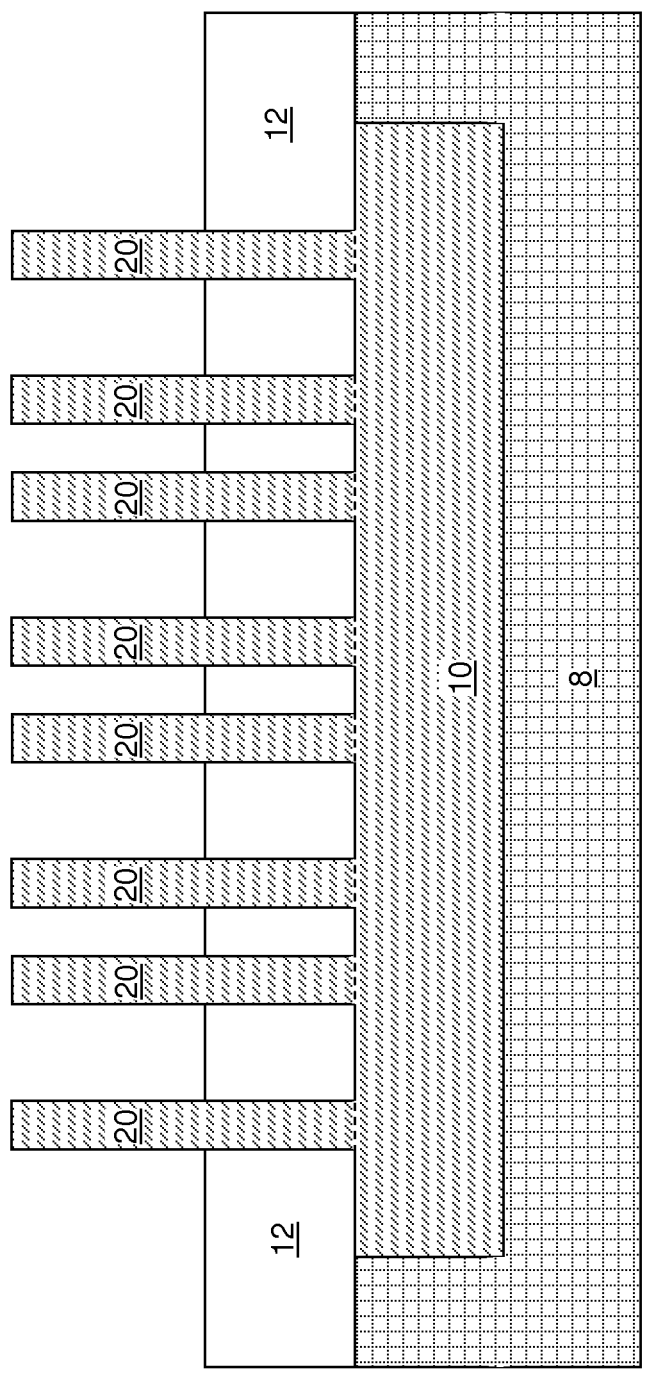
FIG. 3B is a vertical cross-sectional view of the exemplary semiconductor structure along the vertical plane B-B' of FIG. 3A.

Referring to FIGS. 3A and 3B, an upper portion of the semiconductor substrate (8, 10) is patterned by an anisotropic etch. The upper portion of the semiconductor substrate (8, 10) is patterned employing the spacer structures 40 as an etch mask. Thus, the anisotropic etch transfers the pattern of the spacer structures 40 into the upper portion of the semiconductor substrate (8, 10). Remaining portions of the upper portion of the semiconductor substrate (8, 10) include an array of semiconductor fins 20. In one embodiment, the array of semiconductor fins 20 can be remaining portions of the doped semiconductor material portion 10. In one embodiment, a remaining portion of the doped semiconductor material portion 10 can underlie the array of semiconductor fins 20.

Each semiconductor fin 20 has a contiguous inner sidewall that laterally surrounds a cavity therein. Thus, each semiconductor fin 20 can be topologically homeomorphic to a torus, i.e., can be continuously stretched in the form of a torus without forming, or destroying, a singularity (such as creation of a new hole within a surface or elimination of an existing hole). As used herein, a "torus" refers to a geometrical shape as known in mathematics, and being "topologically homeomorphic" refers to having the property of topological homeomorphism as known in mathematics. In one embodiment, the cavities within each semiconductor fin 20 can be rectangular cavities or cylindrical cavities.

Optionally, a shallow trench isolation layer 12 can be formed around the lower portions of the array of semiconductor fins 20. The shallow trench isolation layer 12 includes a dielectric material such as doped or undoped silicon oxide or porous or non-porous organosilicate glass. As such, the shallow trench isolation layer 12 is a dielectric material layer. The shallow trench isolation layer 12 can be formed by deposition of a dielectric material, for example, by chemical vapor deposition (CVD), atomic layer deposition (ALD), and/or spin-on coating. The deposited dielectric material can be self-planarizing, or the top surface of the deposited dielectric material can be planarized by chemical mechanical planarization employing the top surfaces of the array of semiconductor fins 20 as a stopping layer. The top surface of the deposited dielectric material can be recessed as needed to form the shallow trench isolation layer 12. The top surface and the bottom surface of the shallow trench isolation layer 12 can be within two horizontal planes, i.e., can be planar surfaces. The shallow trench isolation layer 12 can partially fill the lower portion of each cavity within the spacer structures 40.

In one embodiment, the shallow trench isolation layer 12 can be performed in another region (not shown) of the exemplary semiconductor structure employed to form additional semiconductor fins (not shown) for forming fin field effect transistors as known in the art.

The doped semiconductor material portion 10 (if present) and the array of semiconductor fins 20 collectively constitute a lower electrode of a capacitor to be subsequently formed. Thus, the lower electrode (10, 20) includes an array of semiconductor fins 20 formed on a substrate (8, 10). The shallow trench isolation layer 12, which is a dielectric material layer, laterally surrounds a lower portion of each semiconductor fin 20. The doped semiconductor material portion 10 is in contact with bottom surfaces of the semiconductor fins 20, and provides an electrically conductive path among the array of semiconductor fins 20. In one embodiment, the doped semiconductor material portion 10 and the array of semiconductor fins 20 can have an identical composition.

Figure 4A:
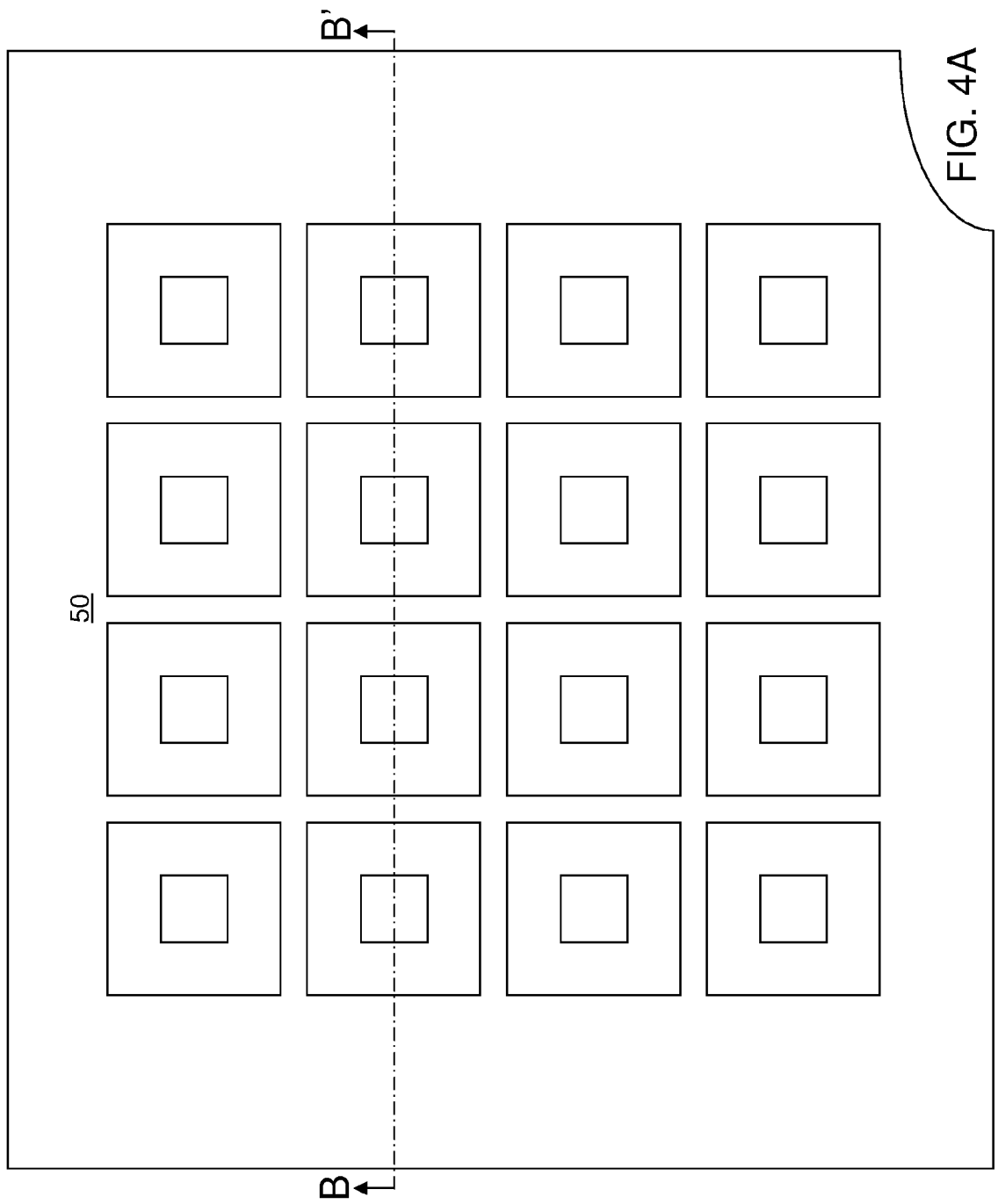
FIG. 4A is a top-down view of the exemplary semiconductor structure after formation of a node dielectric layer according to an embodiment of the present disclosure.
Figure 4B:
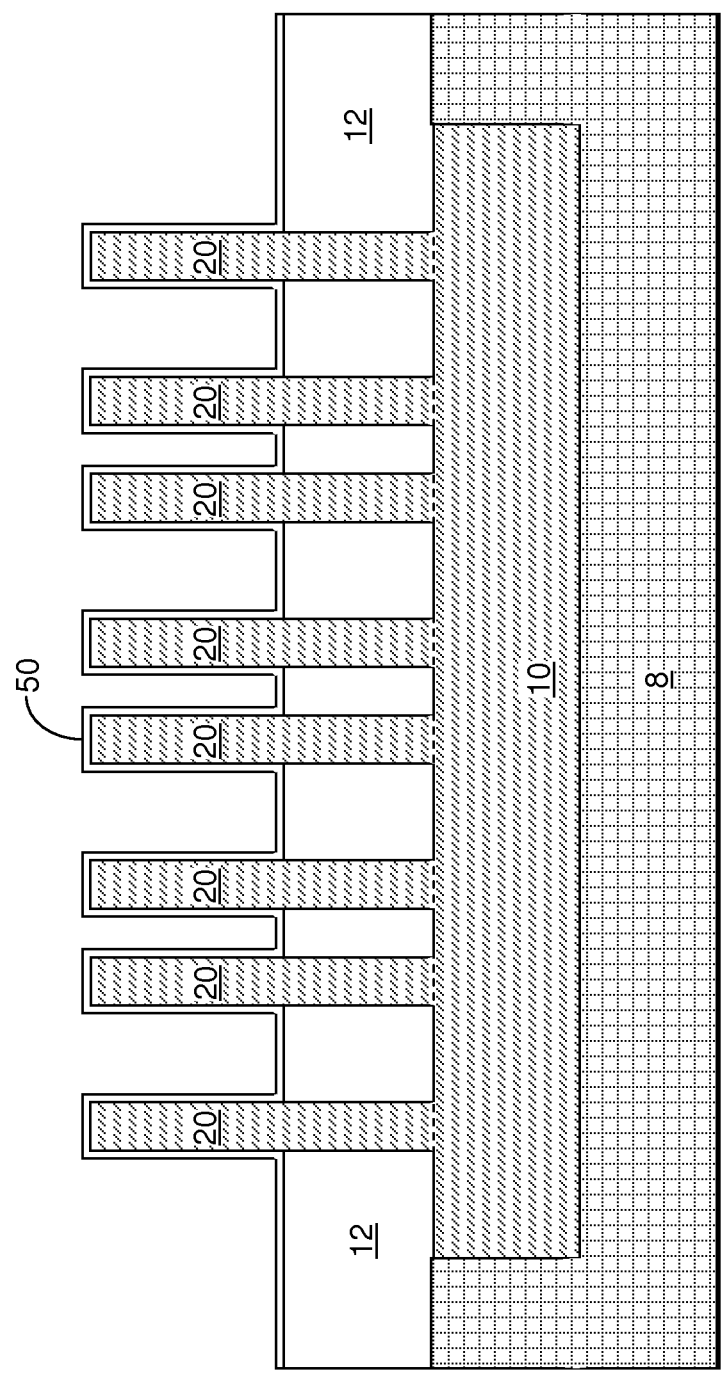
FIG. 4B is a vertical cross-sectional view of the exemplary semiconductor structure along the vertical plane B-B' of FIG. 4A.

Referring to FIGS. 4A and 4B, a node dielectric layer 50 can be formed directly on all physically exposed surfaces of the array of semiconductor fins 20 and the shallow trench isolation layer 12. Specifically, the node dielectric layer 50 can be formed directly on the sidewalls and the top surfaces of the array of semiconductor fins 20 and the top surface of the shallow trench isolation layer 12. The node dielectric layer 50 can include any dielectric material that can be employed as a node dielectric of a capacitor as known in the art. In one embodiment, the node dielectric layer 50 can include silicon nitride, silicon oxide, silicon oxynitride, a dielectric metal oxide, a dielectric metal nitride, and/or a dielectric metal oxynitride. The thickness of the node dielectric layer 50 can be in a range from 1 nm to 10 nm, although lesser and greater thicknesses can also be employed.

In one embodiment, the node dielectric layer 50 can be the same layer as a gate dielectric layer to be subsequently patterned to form gate dielectrics for fin field effect transistors (not shown). In another embodiment, the node dielectric layer 50 can be the same layer as a sacrificial dielectric material layer employed to form disposable gate structures (not shown), which are subsequently replaced with replacement gate structures (not shown) as known in the art. Thus, formation of the node dielectric layer 50 can enable concurrent formation of a gate dielectric layer for a gate-first integration scheme or a sacrificial dielectric material layer for a gate-last integration scheme (i.e., a replacement gate scheme).

Figure 5A:
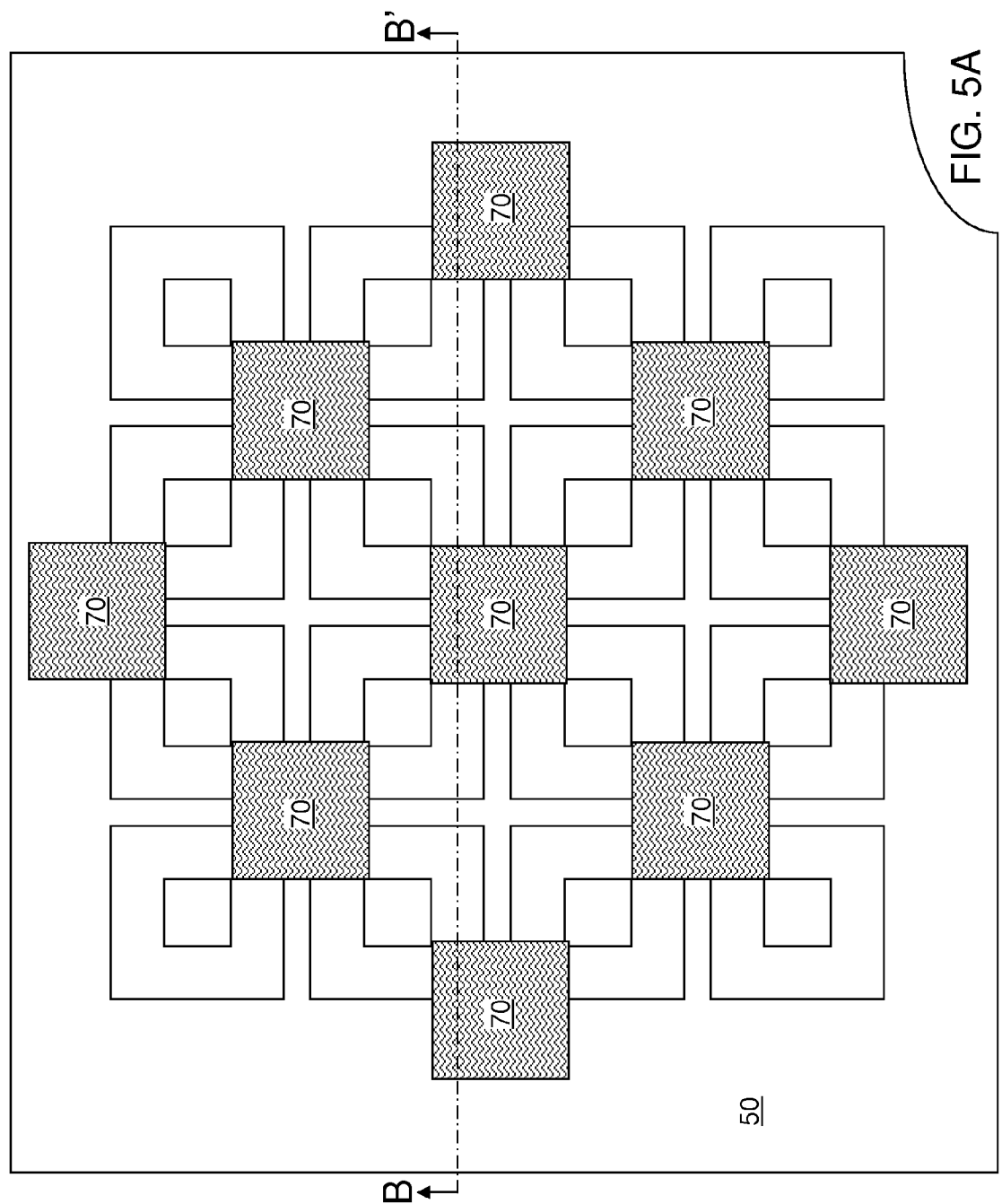
FIG. 5A is a top-down view of the exemplary semiconductor structure after formation of gate-level mandrel structures according to an embodiment of the present disclosure.
Figure 5B:
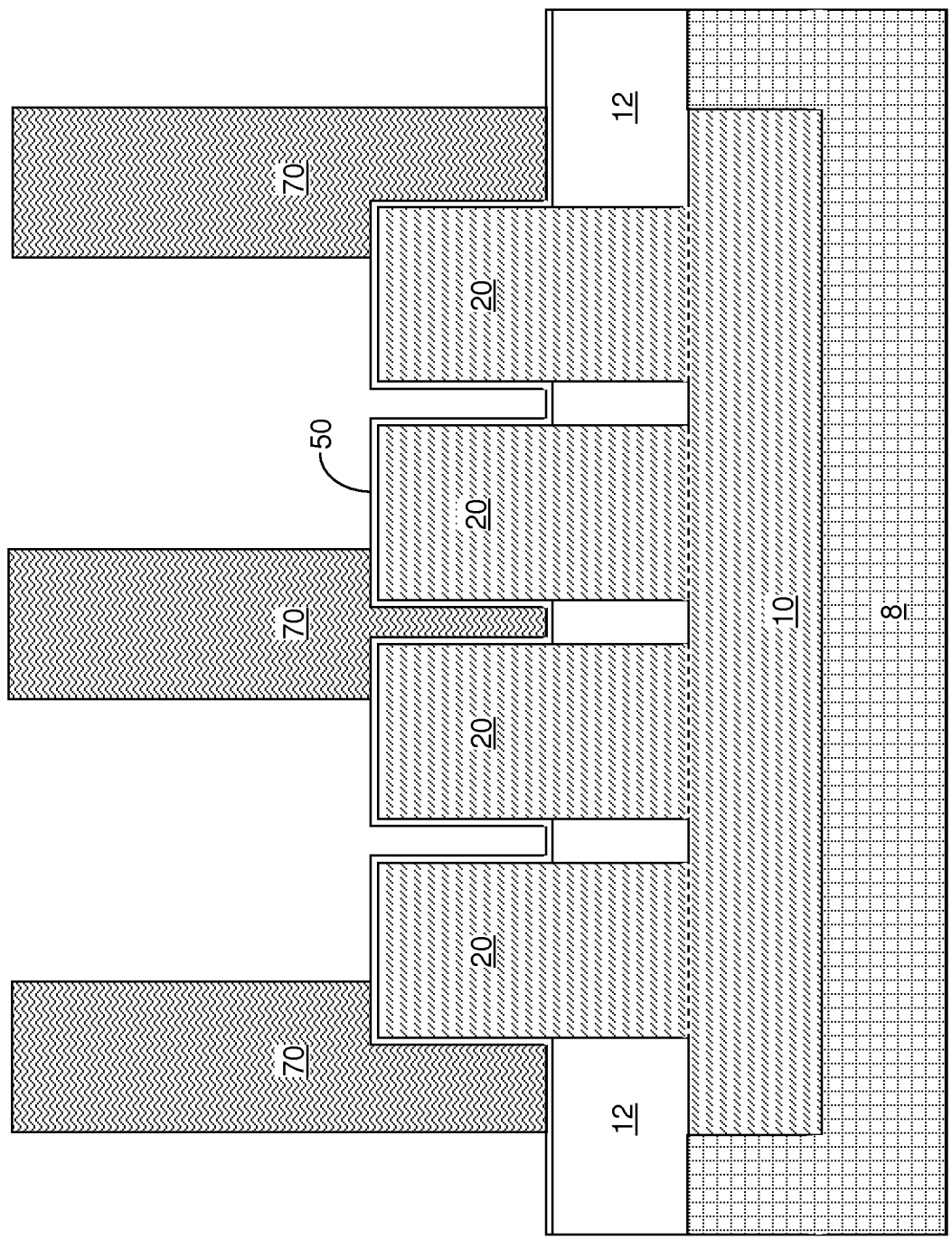
FIG. 5B is a vertical cross-sectional view of the exemplary semiconductor structure along the vertical plane B-B' of FIG. 5A.

Referring to FIGS. 5A and 5B, an array of gate-level mandrel structures 70 is formed over the node dielectric layer 50. The array of gate-level dielectric structures 70 straddles portions of the semiconductor fins 20. The array of the gate-level mandrel structures 70 can be formed, for example, by depositing a disposable mandrel material layer (not shown) and patterning the gate-level mandrel material layer, for example, by a combination of lithographic methods and an etch, which can be an anisotropic etch or an isotropic etch.

In one embodiment, a gate-level mandrel structure 70 can overlie corners of a plurality of semiconductor fins 20. In one embodiment, each gate-level mandrel structure 70 can overlie corner portions of at least two semiconductor fins 20 that are laterally spaced from each other at least by a cavity between two vertical portions of the node dielectric layer 50 prior to formation of the array of gate-level mandrel structures 70. The array of gate-level mandrel structures 70 fills some gaps between a neighboring pair of vertical portions of the node dielectric layer 50.

The array of the gate-level mandrel structures 70 can include a semiconductor material, a dielectric material, or a conductive material, provided that the material of the gate-level mandrel structure 70 can be removed selective to the dielectric material of the node dielectric layer 50. In one embodiment, the array of the gate-level mandrel structures 70 can include silicon, a silicon-germanium alloy, germanium, amorphous carbon, silicon oxide, silicon oxynitride, silicon nitride, a dielectric metal oxide, a dielectric metal nitride, a photoresist material, an organic material, an elemental metal, an intermetallic alloy, a metal oxide, a metal nitride, or any other material different from the material of the node dielectric layer 50. The height of the top surfaces of the gate-level mandrel structures 70, as measured from the topmost surfaces of the node dielectric layer 50, can be, for example, from 12 nm to 1,000 nm, although lesser and greater thicknesses can also be employed. In an illustrative example, the array of the gate-level mandrel structures 70 can include germanium, amorphous carbon, an organic polymer, or an organosilicate glass.

In one embodiment, the array of the gate-level mandrel structures 70 can be a two-dimensional array having a unit cell size that is twice the unit cell size of the two-dimensional array of the semiconductor fins 20. In one embodiment, the two-dimensional array of the semiconductor fins 20 can be a rectangular array, and the array of the gate-level mandrel structures 70 can cover every alternate corner at which four corners of semiconductor fins 20 are present in proximity to one another. In one embodiment, the array of the gate-level mandrel structures 70 can be formed such that the array of the gate-level mandrel structures 70 does not fill any portion of the cavities enclosed within each semiconductor fin 20.

In one embodiment, formation of additional mandrel structures (not shown) designed to induce formation of gate lines by a sidewall transfer method can be performed concurrently with formation of the array of gate-level mandrel structures to form fin field effect transistors as known in the art.

Figure 6B:
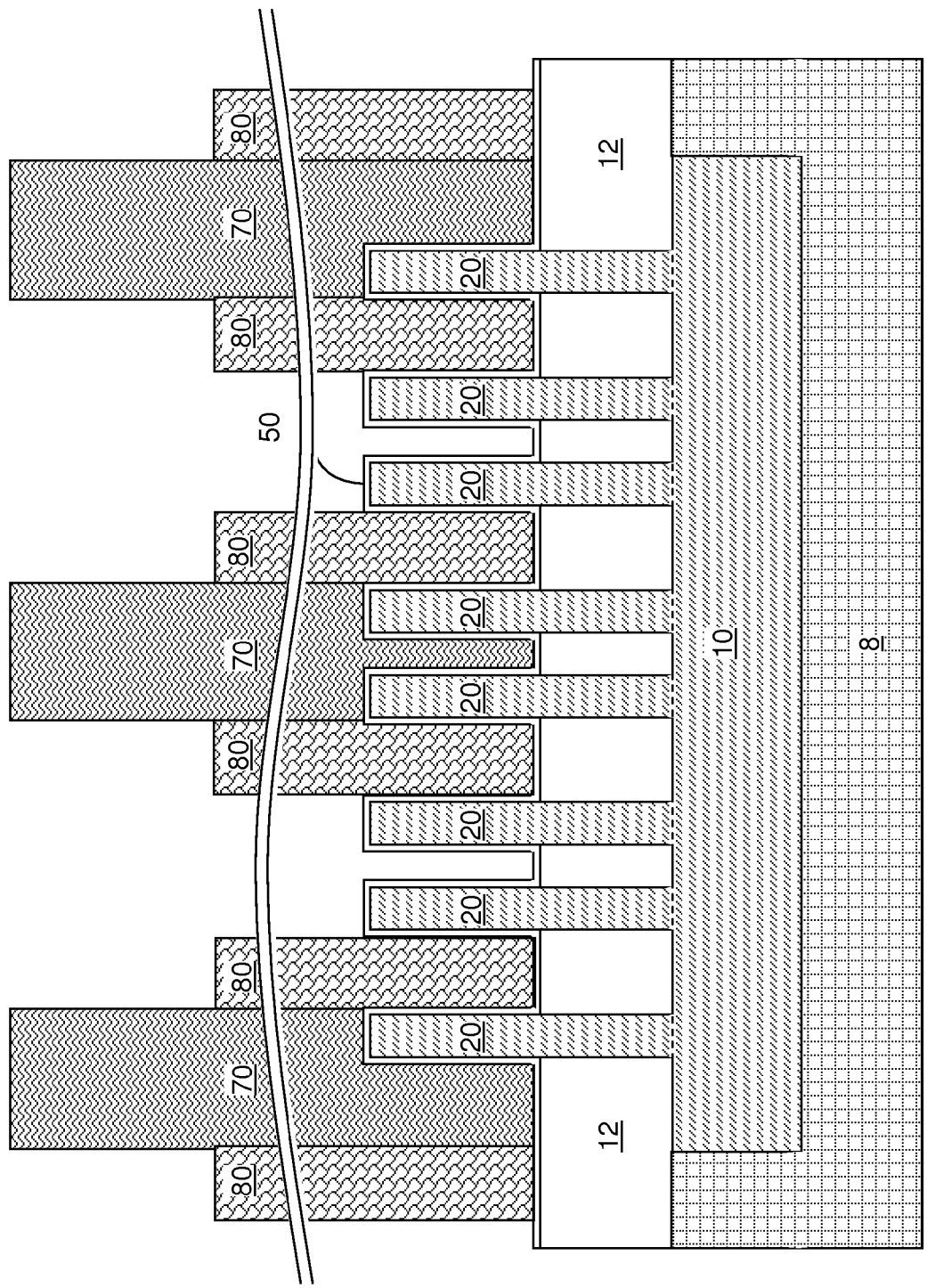
FIG. 6B is a vertical cross-sectional view of the exemplary semiconductor structure along the vertical plane B-B' of FIG. 6A.

Referring to FIGS. 6A and 6B, a conductive-hole containing structure 80 can be formed by depositing, and anisotropically etching, a conductive material layer on the array of gate-level mandrel structures 70. The conductive material layer includes a conductive material that can be removed selective to the dielectric material of the node dielectric layer 50. For example, the conductive material layer can include doped polysilicon or a metallic material. The conductive material layer can be deposited conformally, for example, by chemical vapor deposition (CVD) or atomic layer deposition (ALD). The anisotropic etch may, or may not, be selective to the dielectric material of the node dielectric layer 50. In one embodiment, the anisotropic etch is selective the dielectric material of the node dielectric layer 50. An overetch is performed to remove vertical portions of the conductive material layer that do not surround any gate-level mandrel structure 70. Remaining vertical portions of the conductive material layer collectively constitute the conductive hole-containing structure 80.

The conductive hole-containing structure 80 includes holes therein. In one embodiment, the conductive hole-containing structure 80 can be a single contiguous structure that laterally surrounds all of the gate-level mandrel structures 80. In one embodiment, the number of holes within the conductive hole-containing structures 80 can be the same as the sum of the number of gate-level mandrel structures 80 and the number of locations laterally surrounded by a set of gate-level mandrel structures 80 that can induce formation of a hole that does not include any gate-level mandrel structure 80. In one embodiment, the conductive hole-containing structures 80 can include rectangular holes or elliptical holes (which can include circular holes).

The conductive hole-containing structure 80 constitutes an upper electrode of a capacitor. The conductive hole-containing structure 80 contains a plurality of holes therein. In one embodiment, the conductive hole-containing structure 80 can straddle multiple portions of each of the semiconductor fin 20.

In one embodiment, the conductive hole-containing structure 80 can extend into the cavities defined by a contiguous set of inner sidewalls of a semiconductor fin 20. Bottom surfaces of the conductive hole-containing structure 80 can contact horizontal portions of the node dielectric layer 50 within the cavities. In this case, a cavity defined by a set of contiguous inner sidewalls of a semiconductor fin 20 can be filled with the node dielectric layer 50 and the conductive hole-containing structure 80.

In one embodiment, at least one hole among the plurality of holes of the conductive hole-containing structure 80 can overlie portions of four different semiconductor fins 20 among the array of semiconductor fins 20.

In one embodiment, formation of gate electrodes (not shown) for fin field effect transistors can be performed concurrently with formation of the conductive hole-containing structure 80.

Figure 7A:
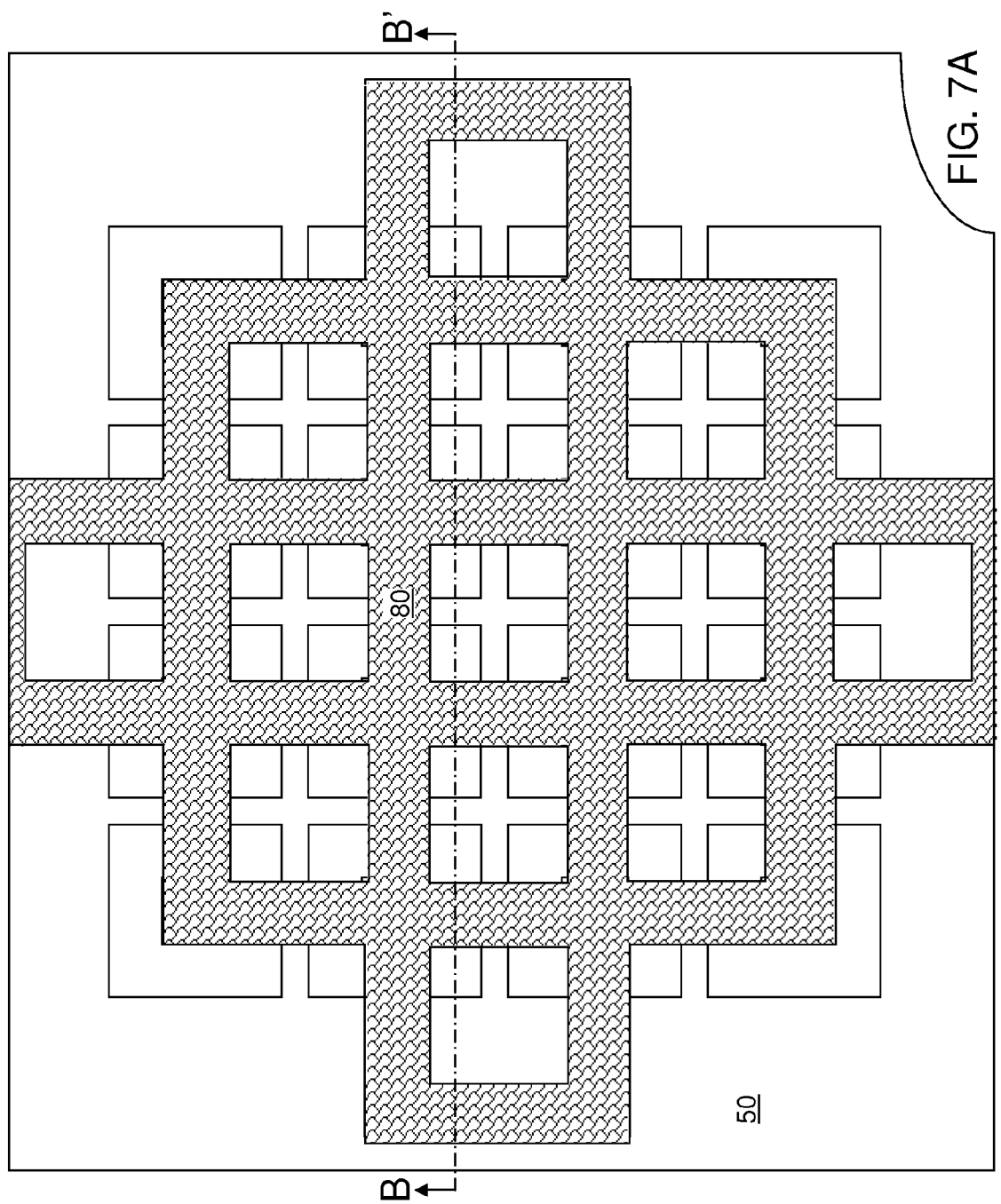
FIG. 7A is a top-down view of the exemplary semiconductor structure after removal of the gate-level mandrel structures according to an embodiment of the present disclosure.
Figure 7B:
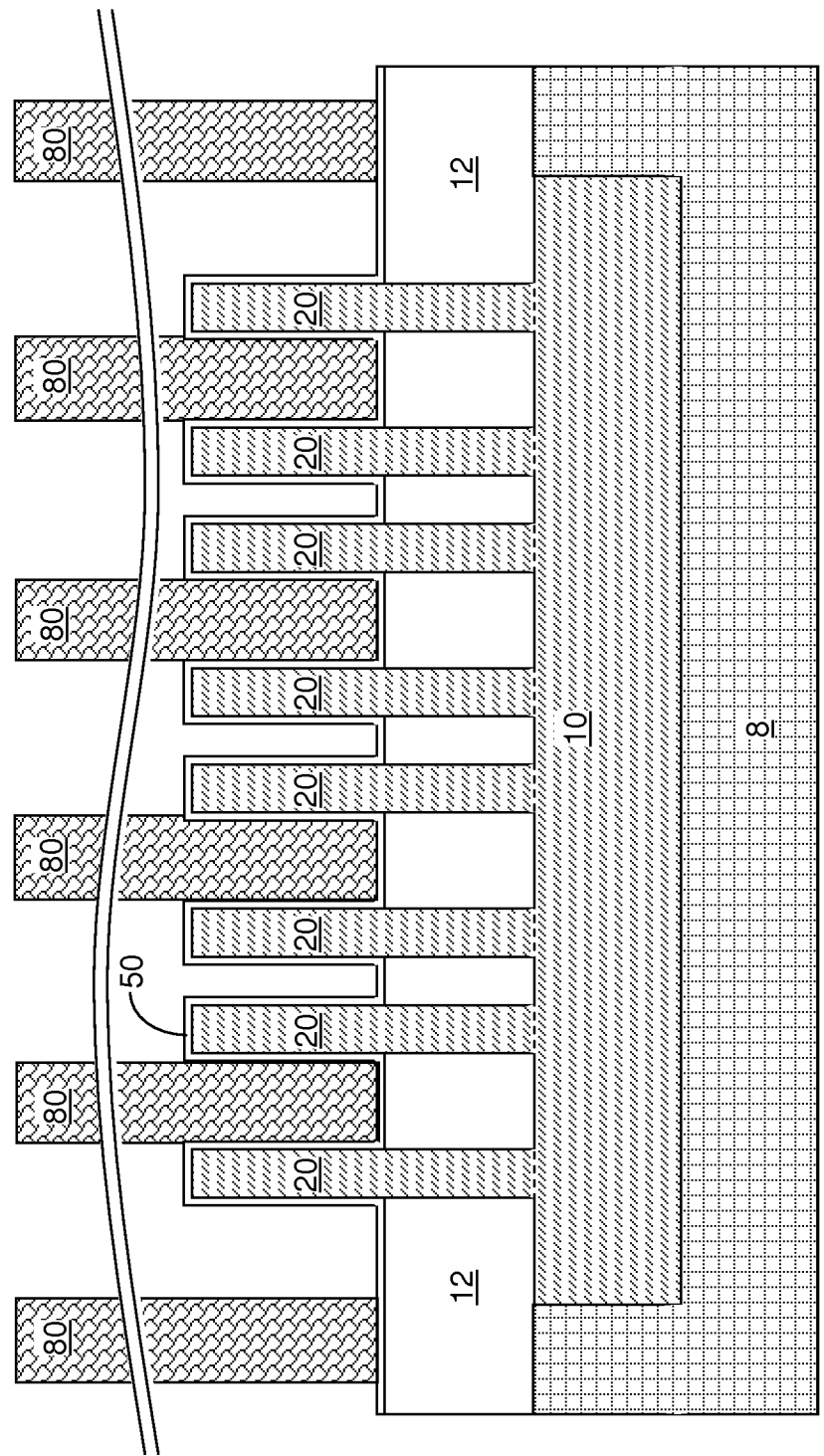
FIG. 7B is a vertical cross-sectional view of the exemplary semiconductor structure along the vertical plane B-B' of FIG. 7A.

Referring to FIGS. 7A and 7B, the array of the gate-level mandrel structures 70 can be removed selective to the conductive hole-containing structure 80 and optionally, selective to the dielectric material of the node dielectric layer 50. An isotropic etch or an anisotropic etch can be employed to remove the array of the gate-level mandrel structures 70. In an illustrative example, the gate-level mandrel structures 70 can include germanium or a silicon-germanium alloy having an atomic concentration of germanium greater than 50%, the conductive hole-containing structure 80 includes silicon or a metallic material, the node dielectric layer 50 includes silicon nitride or a dielectric metal oxide, and a wet etch employing ammonium hydroxide and hydrogen peroxide can be employed to remove the gate-level mandrel structures 70 selective to the conductive hole-containing structure 80 and the node dielectric layer 50.

Alternatively, the conductive hole-containing structure 80 can be formed in any of the following two methods. According to a first alternate method, after depositing the node dielectric, a conductive material layer is deposited and optionally planarized (e.g., by CMP). The top surface of the conductive material layer can be formed above the top surface of the fin. Gate-level mandrel structures are then formed on top of the conductive material layer followed by formation of spacers on the sidewalls of the gate-level mandrel structures. The gate-level mandrel structures them removed. The remaining spacers are used as the mask to etch the conductive material layer to form conductive hole-containing structure 80. The spacers are subsequently removed selective to the conductive hole-containing structure 80.

According to a second alternate method, a structure having a same geometrical feature as the conductive hole-containing structure 80 can be formed as described in the first alternate method except that the structure is a dummy structure. In the later processing step, the dummy structure can be removed after formation of a dielectric layer embedding the dummy structures, and can be replaced by a conductive material to form conductive hole-containing structure 80.

Figure 8B:
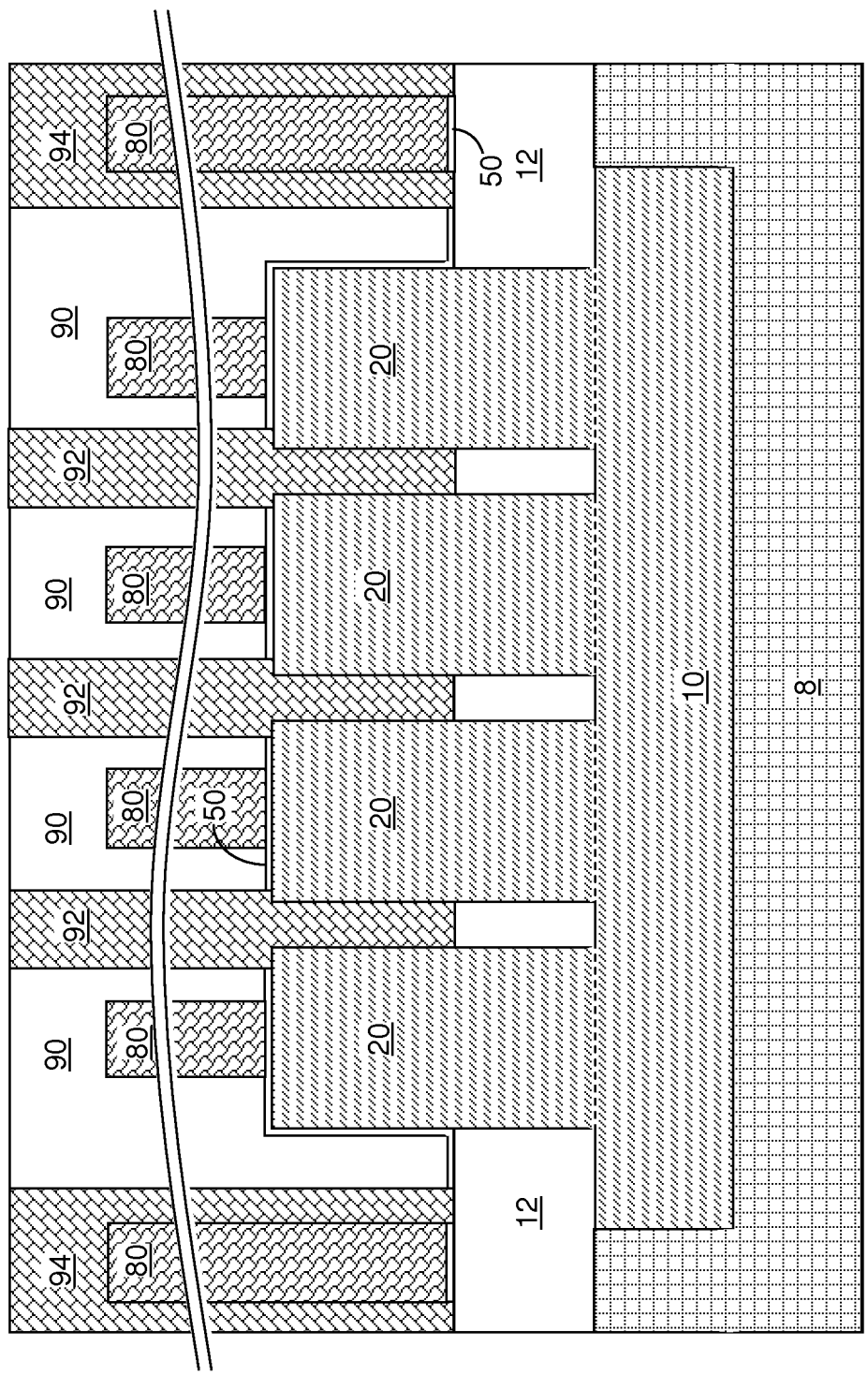
FIG. 8B is a vertical cross-sectional view of the exemplary semiconductor structure along the vertical plane B-B' of FIG. 8A.

Referring to FIGS. 8A and 8B, a contact-level dielectric layer 90 is formed over the conductive hole-containing structure 80 by deposition of a dielectric material. The contact-level dielectric layer 90 includes a dielectric material such as silicon oxide, organosilicate glass, and/or silicon nitride. The contact-level dielectric layer 90 can be deposited, for example, by spin-coating and/or chemical vapor deposition.

Various contact via structures (92, 94) are formed through the contact-level dielectric layer 90. The various contact via structures (92, 94) can include at least one lower electrode contact structure 92 and at least one upper electrode contact structure 94. In one embodiment, the at least one lower electrode contact structure 92 can extend through the plurality of holes within the conductive hole-containing structure 80. The at least one lower electrode contact structure 92 can be formed through the node dielectric layer 50 and directly on sidewalls and top surfaces of the semiconductor fins 20.

In one embodiment, the at least one upper electrode contact structure 94 can be formed on a portion of the upper electrode, i.e., the conductive hole-containing structure 80, that is laterally spaced from the array of semiconductor fins 20 and not overlying any of the semiconductor fins 20. In one embodiment, the at least one upper electrode contact structure 94 can be formed over a dielectric material layer, i.e., the shallow trench isolation layer 12, located on a substrate (8, 10) (or on a substrate (8, 10, 12) that includes the shallow trench isolation layer 12). The contact-level dielectric material layer 90 contacts the node dielectric layer 50 and the conductive hole-containing structure 80. Each of the various contact via structures (92, 94) may include a metal silicide region, a contact liner including a metallic nitride (e.g., TiN), and a contact metal portion including a metal (e.g., W or Cu).

Figure 9:
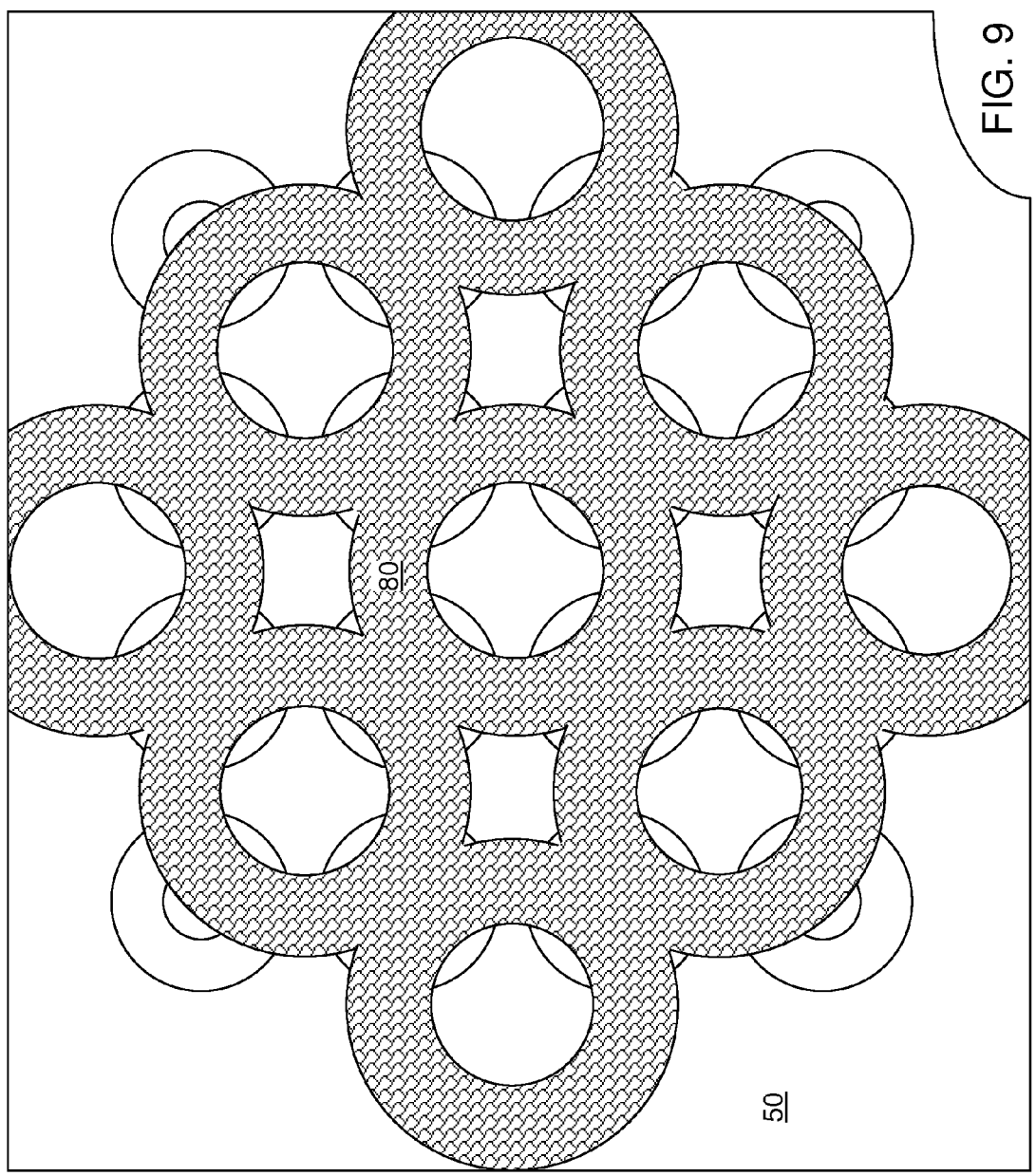
FIG. 9 is a top-down view of a first variation of the exemplary semiconductor structure according to an embodiment of the present disclosure.

Referring to FIG. 9, a first variation of the exemplary semiconductor structure can be derived from the exemplary semiconductor structure by employing the same sequence of processing steps and by changing the horizontal cross-sectional shapes of the disposable mandrel structures 30 into elliptical shapes, and by changing the horizontal cross-sectional shapes of the gate-level mandrel structures 70 into elliptical shapes. The cavities within the semiconductor fins 20 can be cylindrical cavities, and at least one of the plurality of holes within the conductive hole-containing structure 80 has a horizontal cross-sectional shape of an ellipse. Any of the process variations and structural variations that can be made to the exemplary structure can also be made to the first variation of the exemplary semiconductor structure.

Figure 10:
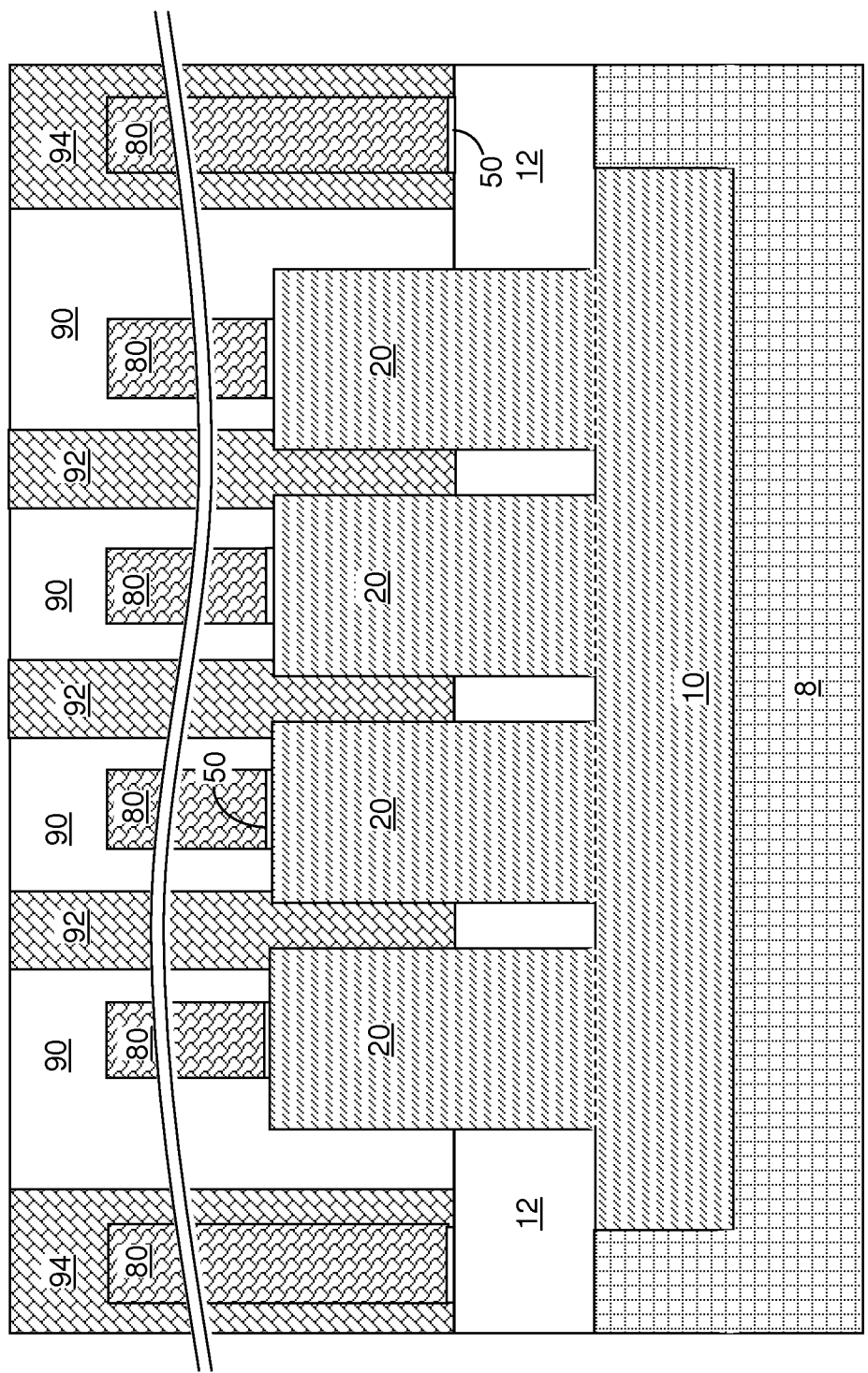
FIG. 10 is a vertical cross-sectional view of a second variation of the exemplary semiconductor structure according to an embodiment of the present disclosure.

Referring to FIG. 10, a second variation of the exemplary semiconductor structure can be derived from the exemplary semiconductor structure or any variation thereof by employing an etch that is not selective to the dielectric material of the node dielectric layer 50 during an anisotropic etch that forms the conductive hole-containing structure 80 or during removal of the gate-level mandrel structures 70. In this case, the node dielectric layer 50 can be divided into a plurality of disjoined portions that do not contact one another. Any of the process variations and structural variations that can be made to the exemplary structure can also be made to the second variation of the exemplary semiconductor structure.

Figure 11:
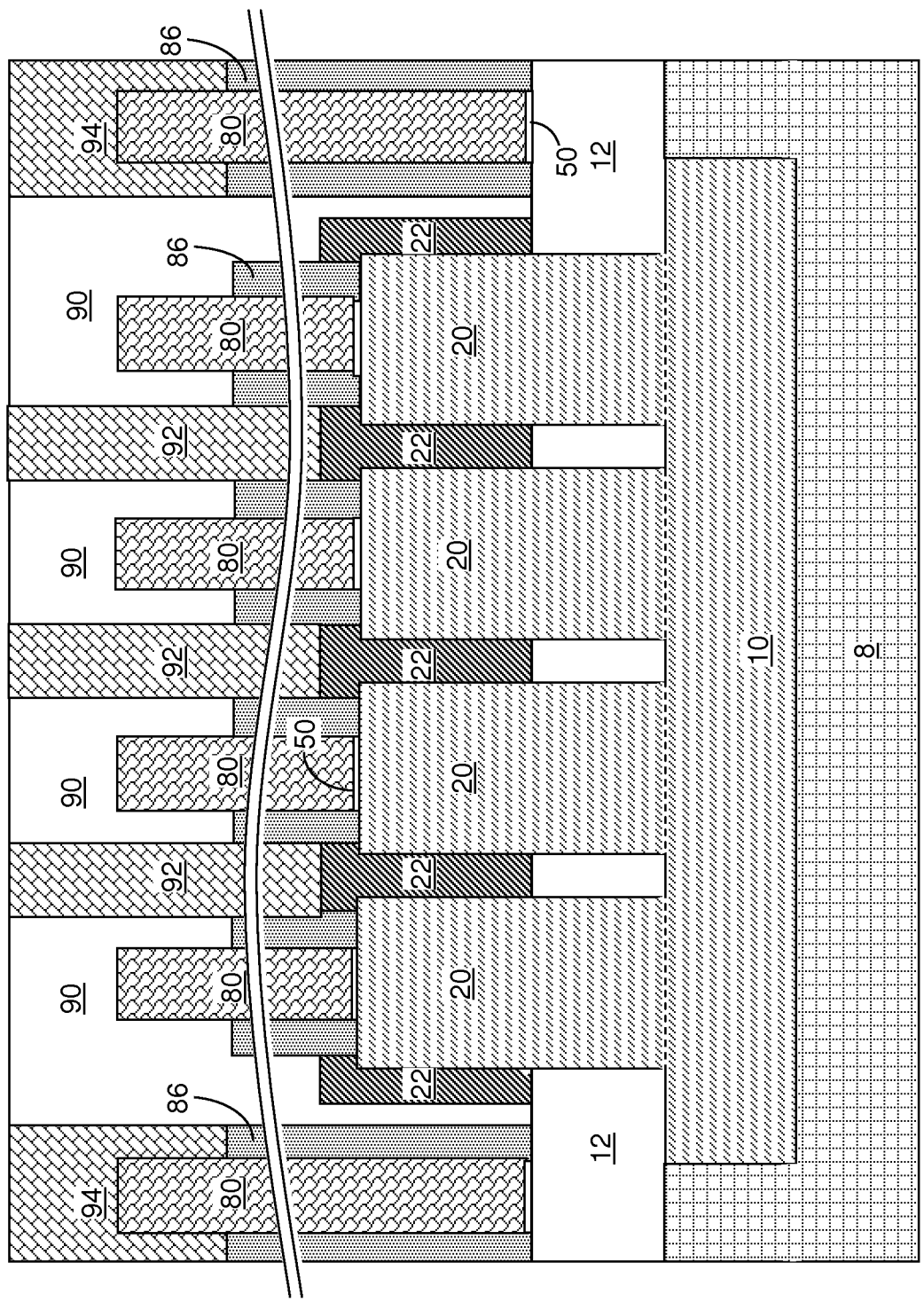
FIG. 11 is a vertical cross-sectional view of a third variation of the exemplary semiconductor structure according to an embodiment of the present disclosure.

Referring to FIG. 11, a third variation of the exemplary structure can be derived from the exemplary structure of FIGS. 7A and 7B or from any variation thereof at a corresponding processing step by forming dielectric spacers 86 and doped semiconductor material portions 22. Specifically, after formation of the conductive hole-containing structure 80 and before formation of the conductive-level dielectric layer 90, dielectric spacers 86 can be formed on the sidewalls of the conductive hole-containing structure 80. The dielectric spacers 86 can be formed by conformal deposition of a dielectric material and an anisotropic etch of the deposited dielectric material. The dielectric material can be different from the dielectric material of the shallow trench isolation layer 12. For example, the shallow trench isolation layer 12 can include silicon oxide, and the dielectric spacers 86 can include silicon nitride. After removal of horizontal portions of the deposited dielectric material, an overetch is performed to remove the dielectric material from between the semiconductor fins 20 so that the sidewalls of the semiconductor fins 20 are physically exposed. Sidewalls of the top portions of the conductive hole-containing structure 80 are also exposed. The remaining vertical portions of the deposited dielectric material laterally surrounding lower portions of the conductive hole-containing structure 80 constitute the dielectric spacers 86.

If any node dielectric 50 is still present on the sidewall surfaces of the semiconductor fins 20, such physically exposed portions of the node dialectic 50 is removed, for example, by a wet etch. Subsequently, a selective epitaxy process of a semiconductor material can be performed to form the doped semiconductor material portions 22. In one embodiment, the selective epitaxy process can be the process for forming source/drain regions of field effect transistors. In other words, a same selective epitaxy process can be employed to form epitaxial source/drain regions (such as raised source/drain regions) of fin field effect transistors and the doped semiconductor material portions 22 simultaneously. A semiconductor material is deposited on the exposed sidewalls of semiconductor fins 20 that are not covered by conductive hole-containing structure 80 and the dielectric spacers 86.

The doped semiconductor material portions can be epitaxial semiconductor material portions, and can be formed with in-situ doped during the epitaxial deposition process, or can be formed by deposition of an epitaxial semiconductor material followed by ex-situ doping by ion implantation, plasma doping, gas phase doping or any other suitable techniques. Each of the doped semiconductor material portions 22 can laterally contact a plurality of semiconductor fins 20. The semiconductor fins 20 are electrically shorted by the doped semiconductor material portions 22, which can be doped epitaxial semiconductor material portions that are epitaxially aligned to the single crystalline structures of the semiconductor fins 20. The doped semiconductor material portions 22 can lower electrical resistance of the lower electrode of the capacitor. The epitaxial deposition process also helps for landing the contact via structures in a subsequent contact formation process because the semiconductor fins 20 become merged by doped semiconductor material portions that electrically connect the semiconductor fins 20. In this embodiment, the lower electrode of the capacitor includes the array of semiconductor fins 20 and the doped semiconductor material portions 22 that provide lateral electrically conductive paths among the array of semiconductor fins 22.

Subsequently, the processing steps of FIGS. 8A and 8B are performed. The at least one lower electrode contact structure 92 can be formed directly on the doped semiconductor material portions 22 that are grown on the sidewalls of the semiconductor fins 20, and optionally on the top surfaces of the semiconductor fins 20 as well. Any of the process variations and structural variations that can be made to the exemplary structure can also be made to the third variation of the exemplary semiconductor structure.

Figure 12:
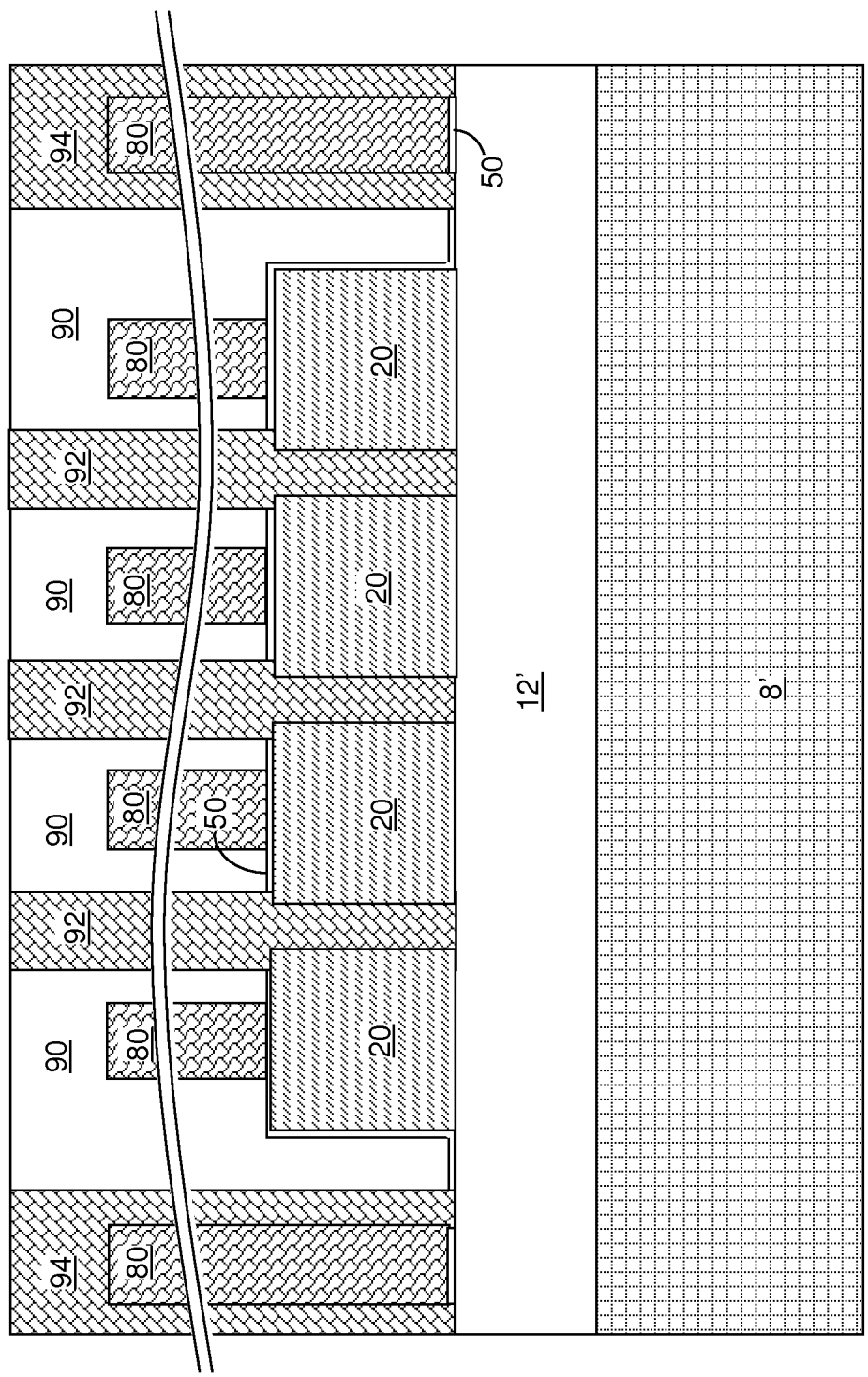
FIG. 12 is a vertical cross-sectional view of a fourth variation of the exemplary semiconductor structure according to an embodiment of the present disclosure.

Referring to FIG. 12, a fourth variation of the exemplary semiconductor structure can be formed by employing a semiconductor-on-insulator (SOI) substrate including a handle substrate 8', a buried insulator layer 12' which is a dielectric material layer, and a top semiconductor layer that is patterned into an array of semiconductor fins 20. In this case, the array of semiconductor fins 20 can have the same horizontal cross-sectional shapes as the semiconductor fins 20 shown in FIGS. 3A and 3B, and the bottom surfaces of the semiconductor fins 20 can contact the top surface of the buried insulator layer 12'. Any of the process variations and structural variations that can be made to the exemplary structure can also be made to the fourth variation of the exemplary semiconductor structure.

The various semiconductor structures of the present disclosure include a capacitor that employs semiconductor fins as portions of a lower electrode. A gate level conductive material can be patterned to form an upper electrode. The capacitor of the present disclosure can be formed employing the same processing steps as the processing steps employed for formation of fin field effect transistors with a minimal number of additional processing steps. Because contact structures can be formed directly on each semiconductor fin through the holes in the upper electrode, internal resistance of the lower electrode of the capacitor of the present disclosure can be minimized. Thus, a high performance capacitor can be formed with minimal alteration of processing sequences for manufacturing fin field effect transistors.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising a capacitor, said capacitor comprising:
    a lower electrode including an array of semiconductor fins located on a substrate, each of said semiconductor fins having a contiguous inner sidewall that laterally surrounds a cavity therein;
    a node dielectric layer contacting sidewalls and top surfaces of said array of semiconductor fins;
        an upper electrode including a conductive hole-containing structure that contains a plurality of holes therein, said conductive hole-containing structure straddling multiple portions of each of said semiconductor fins; and
    at least one lower electrode contact structure, each of said at least one lower electrode contact structure extending through one of said plurality of holes and contacting sidewalls of one of said semiconductor fins.

2. The semiconductor structure of claim 1, further comprising at least one upper electrode contact structure contacting a portion of said upper electrode that is laterally spaced from said array of semiconductor fins.

3. The semiconductor structure of claim 2, further comprising a dielectric material layer underlying said at least one upper electrode contact structure.

4. The semiconductor structure of claim 1, wherein said upper electrode extends into said cavities and bottom surfaces of said upper electrode contact horizontal portions of said node dielectric layer within said cavities.

5. The semiconductor structure of claim 1, wherein at least one hole among said plurality of holes overlies portions of four different semiconductor fins among said array of semiconductor fins.

6. The semiconductor structure of claim 1, wherein said cavities are rectangular cavities or cylindrical cavities, and at least one of said plurality of holes has a horizontal cross-sectional shape of a rectangle or an ellipse.

7. The semiconductor structure of claim 1, further comprising a contact-level dielectric material layer contacting said node dielectric layer and said upper electrode.

8. The semiconductor structure of claim 1, further comprising a doped semiconductor material portion in contact with bottom surfaces of said semiconductor fins and providing an electrically conductive path among said array of semiconductor fins.

9. A semiconductor structure comprising a capacitor, said capacitor comprising:
    a lower electrode including an array of semiconductor fins located on a substrate, each of said semiconductor fins having a contiguous inner sidewall that laterally surrounds a cavity therein;
    a node dielectric layer contacting sidewalls and top surfaces of said array of semiconductor fins;
    an upper electrode including a conductive hole-containing structure that contains a plurality of holes therein, said conductive hole-containing structure straddling multiple portions of each of said semiconductor fins; and
    at least one doped semiconductor material portion laterally contacting sidewalls of multiple semiconductor fins among said array of semiconductor fins.

10. The semiconductor structure of claim 9, further comprising at least one lower electrode contact structure, each of said at least one lower electrode contact structure extending through one of said plurality of holes and contacting sidewalls of one of said semiconductor fins.

11. A method of forming a semiconductor structure including a capacitor, said method comprising:
    forming a lower electrode including an array of semiconductor fins on a substrate, each of said semiconductor fins having a contiguous inner sidewall that laterally surrounds a cavity therein;
    forming a node dielectric layer directly on sidewalls and top surfaces of said array of semiconductor fins;
    forming an upper electrode including a conductive hole-containing structure, wherein said conductive-hole containing structure contains a plurality of holes therein and straddles multiple portions of each of said semiconductor fins; and
    forming at least one lower electrode contact structure through said plurality of holes and directly on sidewalls of said semiconductor fins.

12. The method of claim 11, wherein said at least one lower electrode contact structure is formed directly on top surfaces of said semiconductor fins.

13. The method of claim 11, further comprising forming at least one upper electrode contact structure on a portion of said upper electrode that is laterally spaced from said array of semiconductor fins.

14. The method of claim 11, further comprising:
    forming dielectric spacer on lower portions of the upper electrode; and
    forming at least one doped semiconductor material portion directly on sidewalls of semiconductor fins among said array of semiconductor fins, wherein said lower electrode further includes said at least one doped semiconductor material portion.

15. The method of claim 11, wherein said array of semiconductor fins is formed by:
    forming an array of disposable mandrel structures over a doped semiconductor material portion in said substrate;
    forming spacer structures around said disposable mandrel structures;
    removing said array of disposable mandrel structures selective to said spacer structures; and
    patterning said doped semiconductor material portion employing said spacer structures as an etch mask, wherein remaining portions of said doped semiconductor material portion include said array of semiconductor fins.

16. The method of claim 11, wherein said conductive hole-containing structure is formed by:

forming an array of gate-level mandrel structures on said node dielectric; and depositing, and anisotropically etching, a conductive material layer on said array of gate-level mandrel structures, wherein remaining vertical portions of said conductive material layer constitute said conductive hole-containing structure.

17. The method of claim 11, further comprising:

forming a contact-level dielectric layer over said node dielectric layer and said conductive hole-containing structure; and forming contact via structures through said contact-level dielectric layer.

18. The method of claim 11, wherein said lower electrode includes a semiconductor material portion underlying, and contacting, said array of semiconductor fins.

19. The method of claim 11, further comprising filling said cavities with said node dielectric layer and said conductive hole-containing structure.

* * * * *